US007109733B2

(12) United States Patent
Gudin et al.

(10) Patent No.: US 7,109,733 B2
(45) Date of Patent: Sep. 19, 2006

(54) TEST HEAD DOCKING SYSTEM AND METHOD

(75) Inventors: Naum Gudin, Cherry Hill, NJ (US); Christopher L. West, Tabernacle, NJ (US); I. Marvin Weilerstein, Jenkintown, PA (US); Nils O. Ny, Yardley, PA (US); Alyn R. Holt, Cherry Hill, NJ (US)

(73) Assignee: inTEST Corporation, Wilmington, DE (US)

( * ) Notice: Subject to any disclaimer, the term of this patent is extended or adjusted under 35 U.S.C. 154(b) by 0 days.

(21) Appl. No.: 10/484,014

(22) PCT Filed: Jul. 12, 2002

(86) PCT No.: PCT/US02/22193

§ 371 (c)(1),
(2), (4) Date: Jul. 7, 2004

(87) PCT Pub. No.: WO03/008984

PCT Pub. Date: Jan. 30, 2003

(65) Prior Publication Data

US 2004/0239353 A1    Dec. 2, 2004

Related U.S. Application Data

(60) Provisional application No. 60/305,633, filed on Jul. 16, 2001.

(51) Int. Cl.
G01R 31/02    (2006.01)

(52) U.S. Cl. .................................. 324/758; 324/158.1
(58) Field of Classification Search ................ 414/590; 324/158.1, 754–758, 73.1; 73/866.5, 862.01; 33/533, 645
See application file for complete search history.

(56) References Cited

U.S. PATENT DOCUMENTS

| 4,589,815 A | 5/1986 | Smith |
| 4,705,447 A * | 11/1987 | Smith ........................ 414/590 |
| 4,715,574 A | 12/1987 | Holt et al. |

(Continued)

FOREIGN PATENT DOCUMENTS

WO    WO 02/39127 A2    5/2002

OTHER PUBLICATIONS

A. H. Slocum: "Kinematic couplings for precision fixturing—part 1: Formulation of design parameters"—Precision Engineering, Apr. 1988 vol. 10, No. 2, pp. 85-91.

(Continued)

*Primary Examiner*—Vinh P. Nguyen
(74) *Attorney, Agent, or Firm*—RatnerPrestia

(57) ABSTRACT

A system for docking an electronic test head with a handling apparatus is provided. The system includes an assembly for at least partially aligning and subsequently bringing together the electronic test head and the handling apparatus. The system also includes a power driven actuator for providing only partially powered assistance in bringing together the electronic test head and the handling apparatus.

41 Claims, 31 Drawing Sheets

U.S. PATENT DOCUMENTS

| | | |
|---|---|---|
| 4,893,074 A | 1/1990 | Holt et al. |
| 5,030,869 A | 7/1991 | Holt et al. |
| 5,450,766 A | 9/1995 | Holt |
| 5,600,258 A | 2/1997 | Graham et al. |
| 5,600,285 A | 2/1997 | Sachs et al. |
| 5,608,334 A | 3/1997 | Holt |
| 5,654,631 A | 8/1997 | Ames |
| 5,678,944 A | 10/1997 | Slocum et al. |
| 5,744,974 A | 4/1998 | Bogden |
| 5,821,764 A | 10/1998 | Slocum et al. |
| 5,900,736 A | 5/1999 | Sovik et al. |
| 5,931,048 A | 8/1999 | Slocum et al. |
| 5,949,002 A | 9/1999 | Alden |
| 5,982,182 A | 11/1999 | Chiu et al. |
| 6,043,667 A | 3/2000 | Cadwallader et al. |
| 6,057,695 A | 5/2000 | Holt et al. |
| 6,104,202 A | 8/2000 | Slocum et al. |
| 6,407,541 B1 | 6/2002 | Hannan et al. |
| 6,617,867 B1 * | 9/2003 | Bruno et al. ............ 324/758 |

OTHER PUBLICATIONS

International Search Report for PCT Application PCT/US02/22193, mailed Feb. 21, 2003.

* cited by examiner

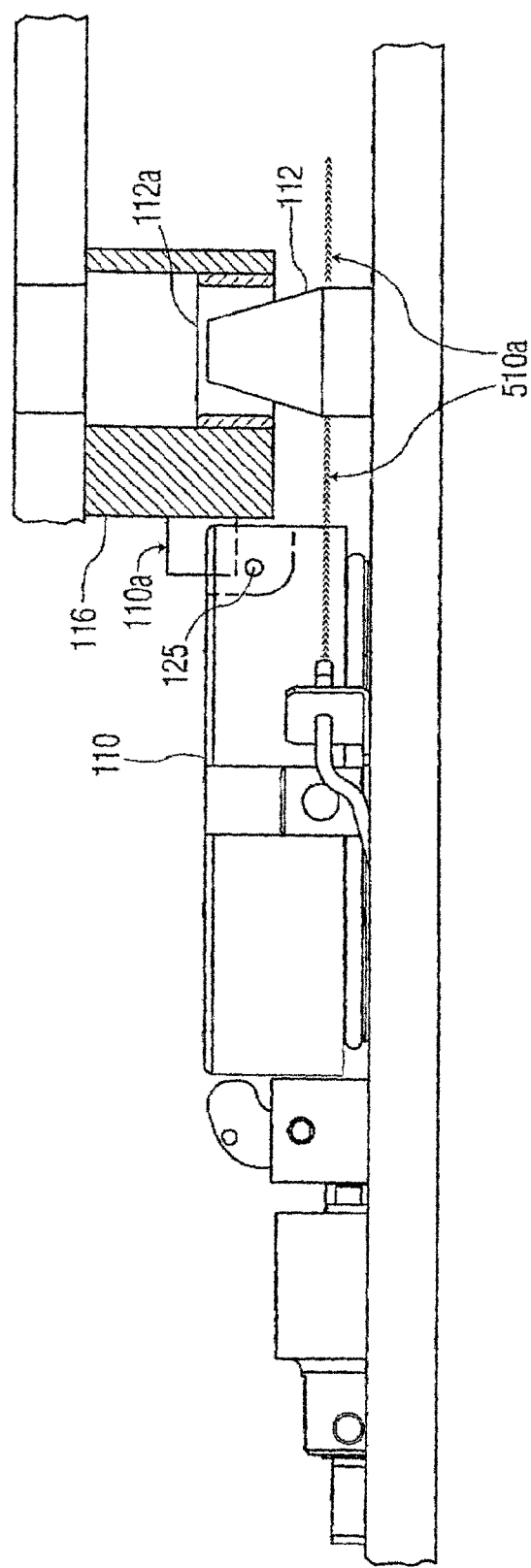

TEST HEAD DOCKING SYSTEM AND METHOD

THIS APPLICATION IS A U.S. NATIONAL PHASE APPLICATION OF PCT INTERNATIONAL APPLICATION PCT/US02/22193 WHICH CLAIMS PRIORITY BASED ON U.S. PROVISIONAL APPLICATION 60/305,633, FILED Jul. 16, 2001.

FIELD OF THE INVENTION

This invention relates to the field of electronic test head docking, and more specifically to a method and apparatus for test head docking using cams powered, at least partially, by one or more actuators for docking actuation.

BACKGROUND OF THE INVENTION

In the manufacture of integrated circuits (ICs) and other electronic devices, testing with automatic test equipment (ATE) is performed at one or more stages of the overall process. Special handling apparatus is used which places the device to be tested into position for testing. In some cases, the special handling apparatus may also bring the device to be tested to the proper temperature and/or maintain it at the proper temperature as it is being tested. The special handling apparatus is of various types including "probers" for testing unpackaged devices on a wafer and "device handlers" for testing packaged parts; herein, "handling apparatus" will be used to refer to all types of such apparatus. The electronic testing itself is provided by a large and expensive ATE system which includes a test head which is required to connect to and dock with the handling apparatus. The Device Under Test (DUT) requires precision, high-speed signals for effective testing; accordingly, the "test electronics" within the ATE which are used to test the DUT are typically located in the test head which must be positioned as close as possible to the DUT. The test head is extremely heavy, and as DUTs become increasingly complex with increasing numbers of electrical connections, the size and weight of test heads have grown from a few hundred pounds to presently as much as two or three thousand pounds. The test head is typically connected to the ATE's stationary mainframe by means of a cable, which provides conductive paths for signals, grounds, and electrical power. In addition, the test head may require coolant to be supplied to it by way of flexible tubing, which is often bundled within the cable.

In testing complex devices, hundreds or thousands of electrical connections have to be established between the test head and the DUT. These connections are accomplished with delicate, densely spaced contacts. In testing unpackaged devices on a wafer, the actual connection to the DUT is typically achieved with needle-like probes mounted on a probe card. In testing packaged devices, it is typical to use a test socket mounted on a "DUT board." In either case, the probe card or DUT board is usually fixed appropriately to the handling apparatus, which brings each of a number of DUTs in turn into position for testing. In either case the probe card or DUT board also provides connection points with which the test head can make corresponding electrical connections. The test head is typically equipped with an interface unit that includes contact elements to achieve the connections with the probe card or DUT board. Typically, the contact elements are spring loaded "pogo pins." Overall, the contacts are very fragile and delicate, and they must be protected from damage.

Test head manipulators may be used to maneuver the test head with respect to the handling apparatus. Such maneuvering may be over relatively substantial distances on the order of one meter or more. The goal is to be able to quickly change from one handling apparatus to another or to move the test head away from the present handling apparatus for service and/or for changing interface components. When the test head is held in a position with respect to the handling apparatus such that all of the connections between the test head and probe card or DUT board have been achieved, the test head is said to be "docked" to the handling apparatus. In order for successful docking to occur, the test head must be precisely positioned in six degrees of freedom with respect to a Cartesian coordinate system. Most often, a test head manipulator is used to maneuver the test head into a first position of coarse alignment within approximately a few centimeters of the docked position, and a "docking apparatus" is then used to achieve the final precise positioning. Typically, a portion of the docking apparatus is disposed on the test head and the rest of it is disposed on the handling apparatus. Because one test head may serve a number of handling apparatuses, it is usually preferred to put the more expensive portions of the docking apparatus on the test head. The docking apparatus may include an actuator mechanism which draws the two segments of the dock together, thus docking the test head; this is referred to as "actuator driven" docking. The docking apparatus, or "dock" has numerous important functions, including: (1) alignment of the test head with the handling apparatus, (2) pulling together, and later separating, the test head and the handling apparatus, (3) providing pre-alignment protection for electrical contacts, and (4) latching or holding the test head and the handling apparatus together.

According to the inTEST Handbook (5$^{th}$ Edition © 1996, inTEST Corporation), "Test head positioning" refers to the easy movement of a test head to a handling apparatus combined with the precise alignment to the handling apparatus required for successful docking and undocking. A test head manipulator may also be referred to as a test head positioner. A test head manipulator combined with an appropriate docking means performs test head positioning. This technology is described, for example, in the aforementioned inTEST Handbook. This technology is also described, for example, in U.S. Pat. Nos. 5,608,334, 5,450,766, 5,030,869, 4,893,074, 4,715,574, and 4,589,815, which are all incorporated by reference for their teachings in the field of test head positioning systems. The foregoing patents relate primarily to actuator driven docking. Test head positioning systems are also known where a single apparatus provides both relatively large distance maneuvering of the test head and final precise docking. For example, U.S. Pat. No. 6,057,695, Holt et al., and U.S. Pat. Nos. 5,900,737 and 5,600,258, Graham et al., which are all incorporated by reference, describe a positioning system where docking is "manipulator driven" rather than actuator driven. However, actuator driven systems are the most widely used, and the present invention is directed towards them.

In the typical actuator driven positioning system, an operator controls the movement of the manipulator to maneuver the test head from one location to another. This may be accomplished manually by the operator exerting force directly on the test head in systems where the test head is fully balanced in its motion axes, or it may be accomplished through the use of actuators directly controlled by the operator. In several contemporary systems, the test head is maneuvered by a combination of direct manual force in some axes and by actuators in other axes.

In order to dock the test head with the handling apparatus, the operator must first maneuver the test head to a "ready to dock" position, which is close to and in approximate alignment with its final docked position. The test head is further maneuvered until it is in a "ready to actuate" position where the docking actuator can take over control of the test head's motion. The actuator can then draw the test head into its final, fully docked position. In doing so, various alignment features provide final alignment of the test head. A dock may use two or more sets of alignment features of different types to provide different stages of alignment, from initial to final. It is generally preferred that the test head be aligned in five degrees of freedom before the fragile electrical contacts make mechanical contact. The test head may then be urged along a straight line, which corresponds to the sixth degree of freedom, that is normal to the plane of the interface (typically the plane of the probe card or DUT board); and the contacts will make connection without any sideways scrubbing or forces which can be damaging to them.

As the docking actuator is operating, the test head is typically free to move compliantly in several if not all of its axes to allow final alignment and positioning. For manipulator axes which are appropriately balanced and not actuator driven, this is not a problem. However, actuator driven axes generally require that compliance mechanisms be built into them. Some typical examples are described in U.S. Pat. No. 5,931,048 to Slocum et al and U.S. Pat. No. 5,949,002 to Alden. Often compliance mechanisms, particularly for non-horizontal unbalanced axes, involve spring-like mechanisms, which in addition to compliance add a certain amount of resilience or "bounce back." Further, the cable connecting the test head with the ATE mainframe is also resilient. As the operator is attempting to maneuver the test head into approximate alignment and into a position where it can be captured by the docking mechanism, he or she must overcome the resilience of the system, which can often be difficult in the case of very large and heavy test heads. Also, if the operator releases the force applied to the test head before the docking mechanism is appropriately engaged, the resilience of the compliance mechanisms may cause the test head to move away from the dock. This is sometimes referred to as a bounce back effect.

U.S. Pat. No. 4,589,815, to Smith, discloses a prior art docking mechanism. The docking mechanism illustrated in FIGS. 5A, 5B, and 5C of the '815 patent uses two guide pin and hole combinations to provide final alignment and two circular cams. When the cams are rotated by handles attached to them, the two halves of the dock are pulled together with the guide pins becoming fully inserted into their mating holes. A wire cable links the two cams so that they rotate in synchronism. The cable arrangement enables the dock to be operated by applying force to just one or the other of the two handles. The handles are accordingly the docking actuator in this case.

The basic idea of the '815 dock has evolved as test heads have become larger into docks having three or four sets of guide pins and circular cams interconnected by cables. FIGS. 1A, 1B, 1C, and 1D of the present application illustrate a prior art dock having four guide-pin and hole combinations and four circular cams, which is described in more detail later. Although such four point docks have been constructed having an actuator handle attached to each of the four cams, the dock shown incorporates a single actuator handle that operates a cable driver. When the cable driver is rotated by the handle, the cable is moved so that the four cams rotate in a synchronized fashion. This arrangement places a single actuator handle in a convenient location for the operator. Also, greater mechanical advantage can be achieved by appropriately adjusting the ratio of the diameters of the cams to the diameter of the cable driver.

The docks described in U.S. Pat. Nos. 5,654,631 and 5,744,974 utilize guide pins and holes to align the two halves. However, the docks are actuated by vacuum devices, which urge the two halves together when vacuum is applied. The two halves remain locked together so long as the vacuum is maintained. However, the amount of force that can be generated by a vacuum device is limited to the atmospheric air pressure multiplied by the effective area. Thus, such docks are limited in their application.

The docks disclosed in U.S. Pat. Nos. 5,821,764, 5,982,182, and 6,104,202 use other techniques, such as kinematic couplings, to provide the final alignment between the two halves. Coarse alignment pins may also be utilized to provide an initial alignment. The coarse alignment pins may be provided with a catch mechanism, which captures the guide pin in its hole and prevents it from escaping. The catch mechanism appears to activate automatically in the '764 and '202 patents; whereas, a motor driven device is utilized for each of the three coarse alignment pins in the '182 patent. Also in the '182 patent the three motors may be operated separately to effect planarization between the docked components. In all three patents, a linear actuator is used to finally pull the two halves together. The linear actuator is disclosed as being of the pneumatic type. In docks of this type, it is necessary that another mechanism be used to provide enough pre-alignment to prevent damage to the fragile electrical contacts. For this reason the aforementioned coarse alignment pins are used, which adds to the overall cost and complexity. Thus, two sets of alignment features are provided, namely: (1) coarse alignment pin-hole combinations, and (2) a kinematic coupling. The cam-actuated docks, mentioned previously and to be described next, combine pre-alignment with gussets and cams, precision alignment with guide pins and receptacles, and mechanical advantage and locking with cams and cam followers, in three simple mechanisms. It would be desirable to retain this simplicity and proven techniques in a powered dock for large test heads.

More specifically, the '182 patent discloses that a pair of a ball and groove is termed a "kinematic contact" because the pair provides some of the contacts needed to form the kinematic coupling. Each side of a groove is termed a "kinematic surface" because it provides for contact at a single point. The ball is called a "kinematic mating surface" because it contacts a kinematic surface at only one point. For satisfactory operation of a kinematic coupling, the '182 patent indicates that it is not necessary that grooves be used to form the kinematic surfaces. Other shapes, such as a gothic arch, can be used as well. It is also not necessary that a ball be used as the kinematic mating surface. Other shapes, such as the tip of a cone, can be made to contact a surface at a single point. Likewise, it is not necessary that each kinematic contact include two kinematic surfaces. Examples of other suitable kinematic contacts are: a ball pressing against a flat surface (one kinematic surface per contact); a ball pressing against a tetrahedron (three kinematic surfaces per contact) or a ball pressing against three balls (three kinematic surfaces per contact). Different types of contacts may be used in one coupling as long as there are six kinematic surfaces in total.

Selected details of the construction and operation of the prior art dock illustrated in FIGS. 1A through 1D are herein described. This description includes aspects from an earlier docking apparatus described in U.S. Pat. No. 4,589,815, which is incorporated by reference.

FIG. 1A shows in perspective a test head 100 held in a cradle 190, which is in turn supported by a test head manipulator (not shown). Also shown is a cut away segment of a handler apparatus 108 to which the test head 100 may be docked. FIG. 1B shows device handler 108 in somewhat larger scale and greater detail. (In this particular example the handler apparatus is a packaged device handler, and the test head is docked to it from below.) Briefly looking ahead to the sectional view in FIG. 1C, it is seen that the test head 100 has electrical interface 126, and the handler apparatus 108 has a corresponding electrical interface 128. Electrical interfaces 126 and 128 typically have hundreds or thousands of tiny, fragile electrical contacts (not shown) that must be precisely engaged in a manner to provide reliable corresponding individual electrical connections when the test head is finally docked. As is shown in this exemplary case, the lower surface of handler apparatus 108 contains the handler electrical interface 128, and the test head 100 is docked with a generally upward motion from below. Other orientations are possible and known including, but not limited to: docking to a top surface with a downward motion, to a vertical plane surface with horizontal motion, and to a plane that is at an angle to both the horizontal and vertical.

Returning to FIGS. 1A and 1B, the complete four point docking apparatus is shown; portions of it are attached either to the handler apparatus 108 or to the test head 100. Attached to test head 100 is faceplate 106. Four guide pins 112 are attached to and located near the four corners of faceplate 106. Face plate 106 has a central opening and is attached to test head 100 so that the test head electrical interface 126 (not shown in FIGS. 1A and 1B) projects through the opening and guide pins 112 define an approximate rectangle that has an approximate common center with electrical interface 126.

Gusset plate 114 is attached to the lower surface of the handler apparatus 108. Gusset plate 114 has a central opening and is attached to handler apparatus 108 so that the handler electrical interface 128 projects through the opening. Four gussets 116 are attached to gusset plate 114, one located near each of its four corners. Each gusset 116 has a guide pin hole or receptacle 112a bored in it. Each guide pin hole 112a corresponds to a respective guide pin 112. These are arranged so that when the test head is fully docked, each guide pin 112 will be fully inserted into its respective guide pin hole 112a. The fit of each guide pin 112 in its corresponding hole 112a is a close fit. Thus, the guide pins 112 and guide pin holes 112a provide alignment between the test head 100 and the handler apparatus 108.

Four docking cams 110 are rotatably attached to the face plate 106. Cams 110 are circular and are similar to those described in the '815 patent. In particular each has a side helical groove 129 around its circumference with an upper cutout 125 on the upper face. Each docking cam 110 is located in proximity to a respective guide pin 112 such that it is generally centered on a line extending approximately from the center of the test head electrical interface 126 through the respective guide pin 112 such that guide pin 112 lies between cam 110 and the test head electrical interface 126. The gussets 116 and the corners of the gusset plate 114 have circular cutouts such that when the guide pins 112 are fully inserted into guide pin holes 112a in the gussets, the circumference of each cam 110 is adjacent to and concentric with the circular cutout in its respective gusset 116. This arrangement provides an initial course alignment between the docking components as the test head 100 is first maneuvered into position for docking with handler apparatus 108. Initial coarse alignment may also be provided by the tapered ends of guide pins 112 entering their respective receptacles 112a. The gussets 116, cams 110, and guide pins 112 are arranged so that handler electrical interface 128 is kept separated from test head electrical interface 126 (not shown in FIGS. 1A and 1B) until the guide pins 112 are actually received in their respective guide pin holes 112a. Thus, pre-alignment protection is provided to the electrical contacts.

Thus, two sets of alignment features are provided, namely: (1) the fit of gussets 116 with respect to cams 110, and (2) the guide pin 112 and receptacle 112a combinations.

A circular cable driver 132 with an attached docking handle 135 is also rotatably attached to face plate 106. Docking cable 115 is attached to each of the cams 110, and to cable driver 132. Pulleys 137 appropriately direct the path of the cable to and from cable driver 132. Cable driver 132 can be rotated by means of applying force to handle 135. As cable driver 132 rotates it transfers force to cable 115 which in turn causes cams 110 to rotate in synchronism.

Extending from the circular cutout of each gusset 116 is a cam follower 110a. Cam follower 110a fits into the upper cutout on the upper face of its respective cam 110. FIG. 1C shows in cross section one stage in the process of docking test head 100 with handler apparatus 108. Here guide pins 112 are partially inserted into guide pin holes 112a in gussets 116. It is noted that in this exemplary case, guide pins 112 are tapered near their distal ends and are of constant diameter nearer to their point of attachment to face plate 106. In FIG. 1C guide pins 112 have been inserted into guide pin holes 112a to a point where the region of constant diameter is just entering the guide pin holes 112a. Also in FIG. 1C, each cam follower 110a has been inserted into the upper cutout 125 on the upper face of its respective cam 110 to a depth where it is at the uppermost end of the helical cam groove 129. In this configuration, the dock is ready to be actuated by applying force to the handle 135 (not shown in FIG. 1C) and rotating the cams 110. Accordingly, this configuration may be referred to as the "ready to actuate" position. It is important to note that in this position, alignment in five degrees of freedom has been achieved. In particular, if the plane of the handler apparatus electrical interface 126 is the X-Y plane of three dimensional interface, guide pins 112 having their full diameter inserted into receptacles has established X, Y, and theta Z alignment. Furthermore, the insertion of cam followers 110a fully into all cut outs 125 has established planarization between the handler apparatus electrical interface 126 and the test head electrical interface 128.

FIG. 1D shows in cross section the result of fully rotating cams 110. The test head 100 is now "fully docked" with handler apparatus 108. It is seen that cams 110 have been rotated and have caused cam followers 110a to follow the helical grooves 129 to a point in closer proximity to faceplate 106. In addition, guide pins 112 are fully inserted into their respective guide pin holes 112a. It is observed that the closeness of the fit between the constant diameter region of guide pins 112 and the sides of the respective guide pin holes 112a determines the final alignment between the handler electrical interface 128 and the test head electrical interface 126. Accordingly, a close fit is generally required to provide repeatability of docked position within three to seven thousandths of an inch. Furthermore, the guide pins 112 must be precisely placed on face plate 106 with respect to the gussets once gusset plate 114 has been attached to handler apparatus 108. To facilitate this, the guide pins 112 may be attached in a manner that allows their position to be adjusted. A manner of doing this which is widely practiced is described in the '815 patent.

It is useful to review some information about the movement of the cam followers. FIG. 4 illustrates the vertical position of the cam follower 110a at various points of cam 110 motion. FIG. 4 applies to circular (or cylindrical) cams as well as to linear cams as used in certain docking apparatus manufactured by, for example, Reid Ashman Manufacturing Co. The shapes of the cam groove 129 and cut out 125 are schematically shown; FIG. 4 is not drawn to scale as its purpose is illustrative. The cut out area where the cam follower 110a can enter or exit the cam groove is indicated at point O. The cam follower 110a (illustrated as a dotted circle at various points in cam groove 129) enters the cut out 125 at position 400, and subsequently reaches position 410 corresponding to a "ready to actuate" position. The cut out area is connected to a generally horizontal region of groove 129 between points O and A. This horizontal region is generally one to two cam follower diameters in length (but may sometimes be less) and represents only a small portion (a few degrees) of the total cam motion. Once the cam follower 110a has been inserted to the bottom of the cut out 125, the cam may be rotated to "capture" the cam follower in this horizontal region. The cam follower 110a is "captured" at position 420. At point A the horizontal groove transitions to a sloping groove as the cam is moved further. As the cam is moved the cam follower is accordingly raised or lowered vertically. At point B at the lower end of the slope the groove transitions to a generally horizontal region that is typically at least one or two cam follower diameters long. In this latter region, the cam follower is at the extent of its travel, and the apparatus is fully docked. The apparatus is considered to be latched (or alternatively fully docked and locked) when the cam follower is at point C (illustrated with cam follower 110a at position 440), the furthest extent of the groove. The region from A to B may be referred to as the "midway" region (illustrated with cam follower 110a at position 430), and the region from B to C may be referred to as the docked region.

In light of the foregoing discussion, it is now appropriate to more fully discuss the docking process and define certain terms. The purpose of docking is to precisely mate the test head electrical interface 126 with the handler apparatus electrical interface 128. Each electrical interface 126 and 128 defines a plane, which is typically, but not necessarily, nominally parallel with the distal ends of the electrical contacts. When docked these two planes must be parallel with one another. In order to prevent damage to the electrical contacts, it is preferred to first align the two interfaces 126 and 128 in five degrees of freedom prior to allowing the electrical contacts to come into mechanical contact with one another. If in the docked position the defined planes of the interfaces are parallel with the X-Y plane of a three dimensional Cartesian coordinate system, alignment must occur in the X and Y axes and rotation about the Z axis (Theta Z), which is perpendicular to the X-Y plane, in order for the respective contacts to line up with one another. Additionally, the two planes are made parallel by rotational motions about the X and Y axes. The process of making the two electrical interface planes parallel with one another is called "planarization" of the interfaces; and when it has been accomplished, the interfaces are said to be "planarized" or "coplanar." Once planarized and aligned in X, Y and Theta Z, docking proceeds by causing motion in the Z direction perpendicular to the plane of the handler electrical interface 128. In the process of docking, test head 100 is first maneuvered into proximity of the handler 108. Further maneuvering brings the circular cutouts of the gussets 116 into a first alignment with the cams 110. This position, or one just prior to it, may be considered to be a "ready to dock" position. More generally, "ready to dock" refers to a position where some first coarse alignment means is approximately in position to be engaged. At this stage and depending upon design details, the distal end of the guide pins are ready to enter their respective guide receptacles. Still further maneuvering will bring the test head to a "ready to actuate position," which was defined previously in terms of FIGS. 1A through D. More generally, "ready to actuate" refers to a position where a test head has achieved a position where a docking apparatus may be actuated. At the ready to actuate position, approximate planarization and alignment in X, Y and Theta Z have been achieved. As the dock is actuated and the guide pins 112 become more fully inserted into their respective guide-pin holes 112a, alignment and planarization become more precise. It is noted that in manipulator driven docking, as described in the '258 and '737 patents, sensors detect the equivalent of a ready to actuate position in order to change from a coarse positioning mode to a fine positioning mode. Thus, to one of ordinary skill in the art, sensing a ready to actuate position in an actuator driven dock would be a natural extension (intuitive and obvious) of what is taught and disclosed by the '258 and '737 patents.

Docks of the type described above have been used successfully with test heads weighing up to and over one thousand pounds. However, as test heads have become even larger and as the number of contacts has increased, a number of problems have become apparent. First, the force required to engage the contacts increases as the number of contacts increases. Typically a few ounces per contact is required; thus docking a test head having 1000 or more contacts requires in excess of 100 or 200 pounds for this purpose. With test heads occupying a volume of a cubic yard or more it becomes increasingly difficult for the operators to observe all of the gussets and cams to determine when the test head is in a ready to dock and the ready to actuate positions. Also due to the resiliency of the compliance mechanisms and cable in the test head manipulator, the bounce back effect has made it difficult to maintain the test head in the ready to actuate position while simultaneously initiating the actuation. A further difficulty that arises from the increased amount of force to be overcome by the actuation mechanism is that the cam motion can become unsynchronized due to the stretching of the cable. A similar problem of mechanism distortion is known in docks using solid links and bell cranks.

Docking apparatus such as described above may be characterized by the number of guide pins and receptacles used. The apparatus described in the '815 patent is characterized as a two-point dock, and the apparatus shown in FIGS. 1A through 1D is known as a four point dock. Three point docks following the same general principles are also known and in common use, and the present invention will be described in terms of a three-point configuration. However, this does not limit its application to other configurations.

SUMMARY OF THE INVENTION

In an exemplary embodiment the present invention provides a system and method for docking an electronic test head with a handling apparatus. An assembly is provided for at least partially aligning and subsequently bringing together the electronic test head and the handling apparatus. A power driven actuator provides only partially powered assistance in bringing together the electronic test head and the handling apparatus.

In another exemplary embodiment, the present invention again provides a system and method for docking an electronic test head with a handling apparatus. An assembly is provided for bringing together the electronic test head and the handling apparatus. A mechanism for operating the assembly, and at least one actuator for operating the mechanism, are also provided. At least one sensor is also included for detecting a position of the mechanism.

In another exemplary embodiment, the present invention again provides a system and method for docking an electronic test head with a handling apparatus. An assembly is provided for bringing together the electronic test head and the handling apparatus. A plurality of cams are situated on either the test head or the handling apparatus. The cams are for operating the assembly. A plurality of gussets are situated on the other of the test head and the handling apparatus. Each of the gussets is for aligning adjacent to at least one of the plurality of cams. At least one power driven actuator provides powered operation of the cams. A sensor detects that the test head and the handling apparatus are positioned relative to one another in a coarser one of at least two positions of alignment.

In yet another exemplary embodiment, the present invention again provides a system and method for docking an electronic test head with a handling apparatus. A plurality of cams are situated on either the test head or the handling apparatus. At least one actuator powers the cams. Gussets are provided on the other of the test head and the handling apparatus for mating with the cams in order to dock the test head with the handling apparatus. Cam followers are attached to the gussets for engaging the cams. At least one sensor determines a relative position between the test head and the handling apparatus when at least one of the cam followers is engaged with a respective cam.

In yet another exemplary embodiment, the present invention again provides a system and method for docking an electronic test head with a handling apparatus. An assembly is provided for bringing together the electronic test head and the handling apparatus. At least two cams, situated on one of the test head and the handling apparatus, operate the assembly. A plurality of gussets are situated on the other of the test head and the handling apparatus. Each of the gussets are for aligning adjacent to at least one of the plurality of cams. At least one power driven actuator provides at least partially powered operation of the cams. At least one handle is included for optional manual operation of at least one of the cams, the manual operation being in addition to, or independent of, the at least partially powered operation of the cams. A plurality of alignment features are situated on one of the test head and the handling apparatus. A plurality of alignment feature receptacles are situated on the other of the test head and the handling apparatus for receiving the alignment features.

BRIEF DESCRIPTION OF THE DRAWINGS

FIG. 7A is a cross section of a cam and gusset in a second coarse alignment position.

DETAILED DESCRIPTION OF THE INVENTION

The present invention is directed to improving the basic manual dock as described above. In particular, it is directed towards simplifying the docking of large, heavy test heads having hundreds or thousands of electrical contacts requiring actuation forces of hundreds or thousands of pounds.

The present invention also provides the means to either partially or fully automate the process of docking between the ready to actuate and fully docked positions. The present invention also reduces the amount of cable or linkage stretch that arises in a docking apparatus where the docking forces are very high.

Figure 1A:
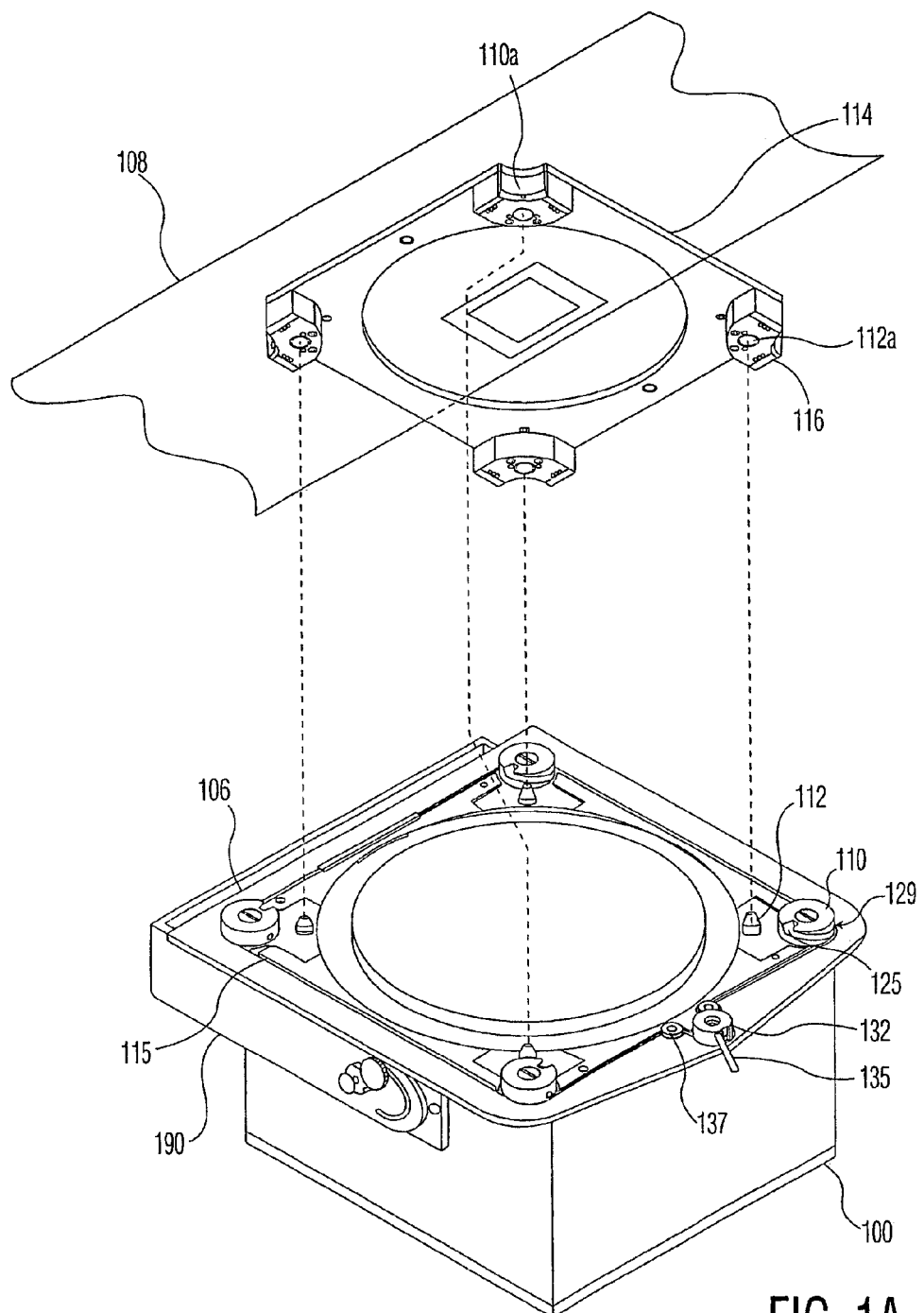
FIG. 1A is a perspective view of a prior art docking apparatus.
Figure 1B:
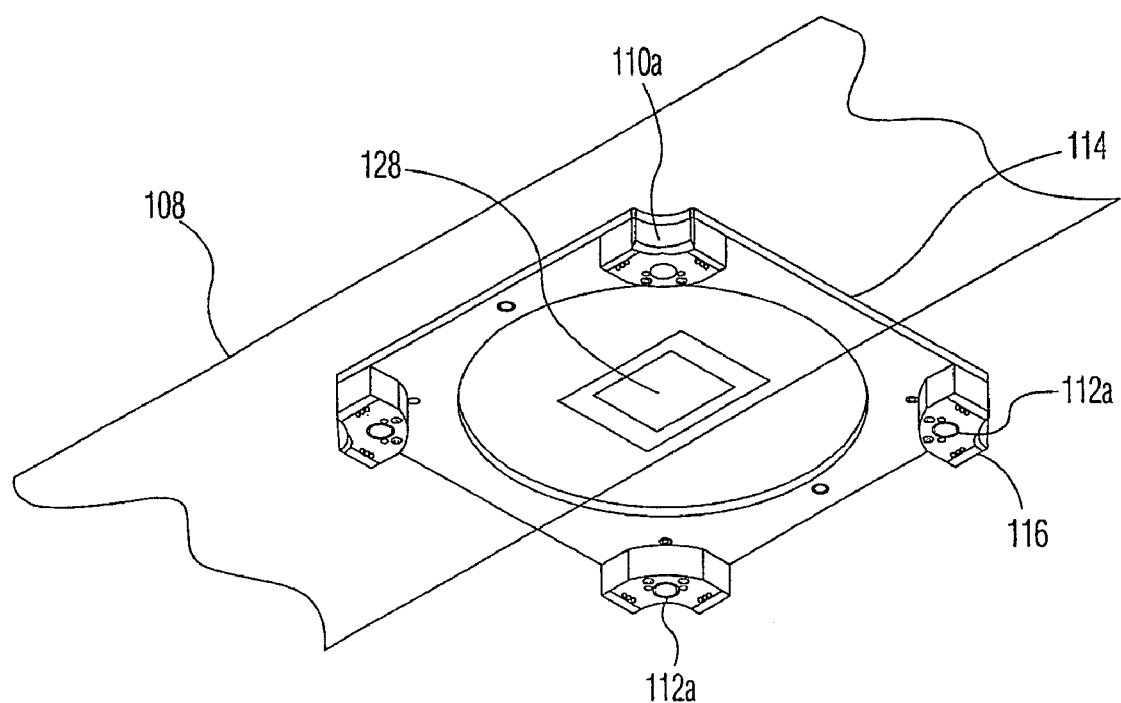
FIG. 1B is a perspective view of the portion of a prior art docking apparatus that is attached to a handling apparatus.
Figure 1C:
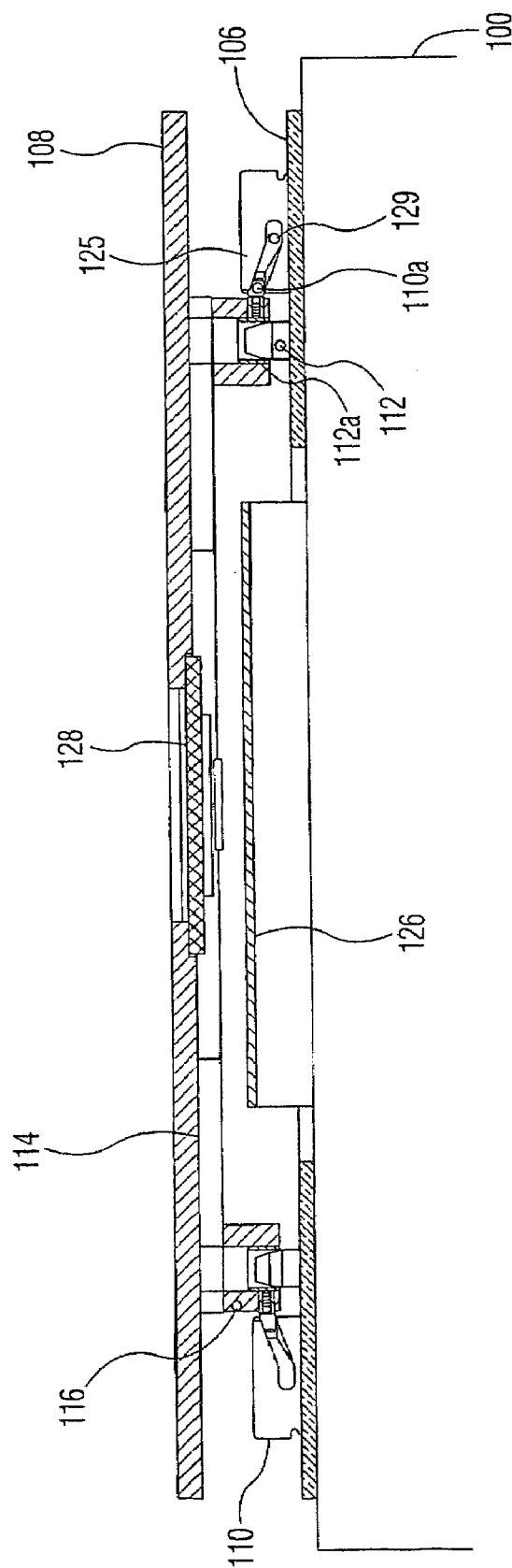
FIG. 1C is a sectional view of the prior art docking apparatus in the ready to actuate position.
Figure 1D:
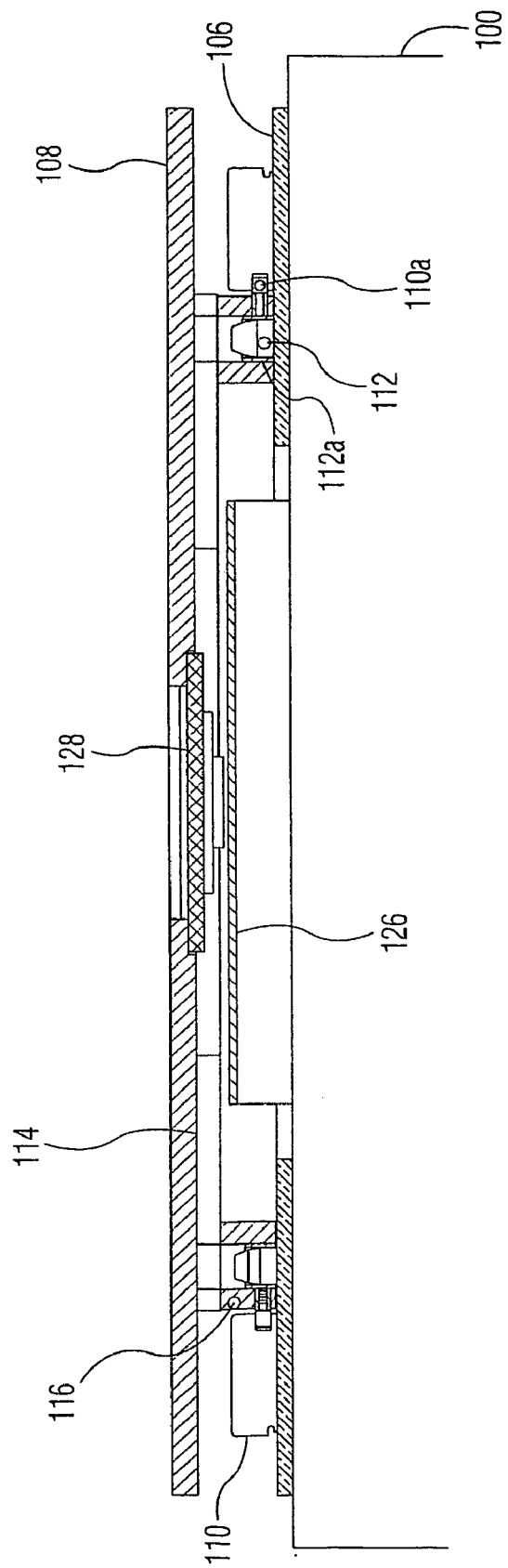
FIG. 1D is a sectional view of the prior art docking apparatus in the fully docked position.
Figure 2:
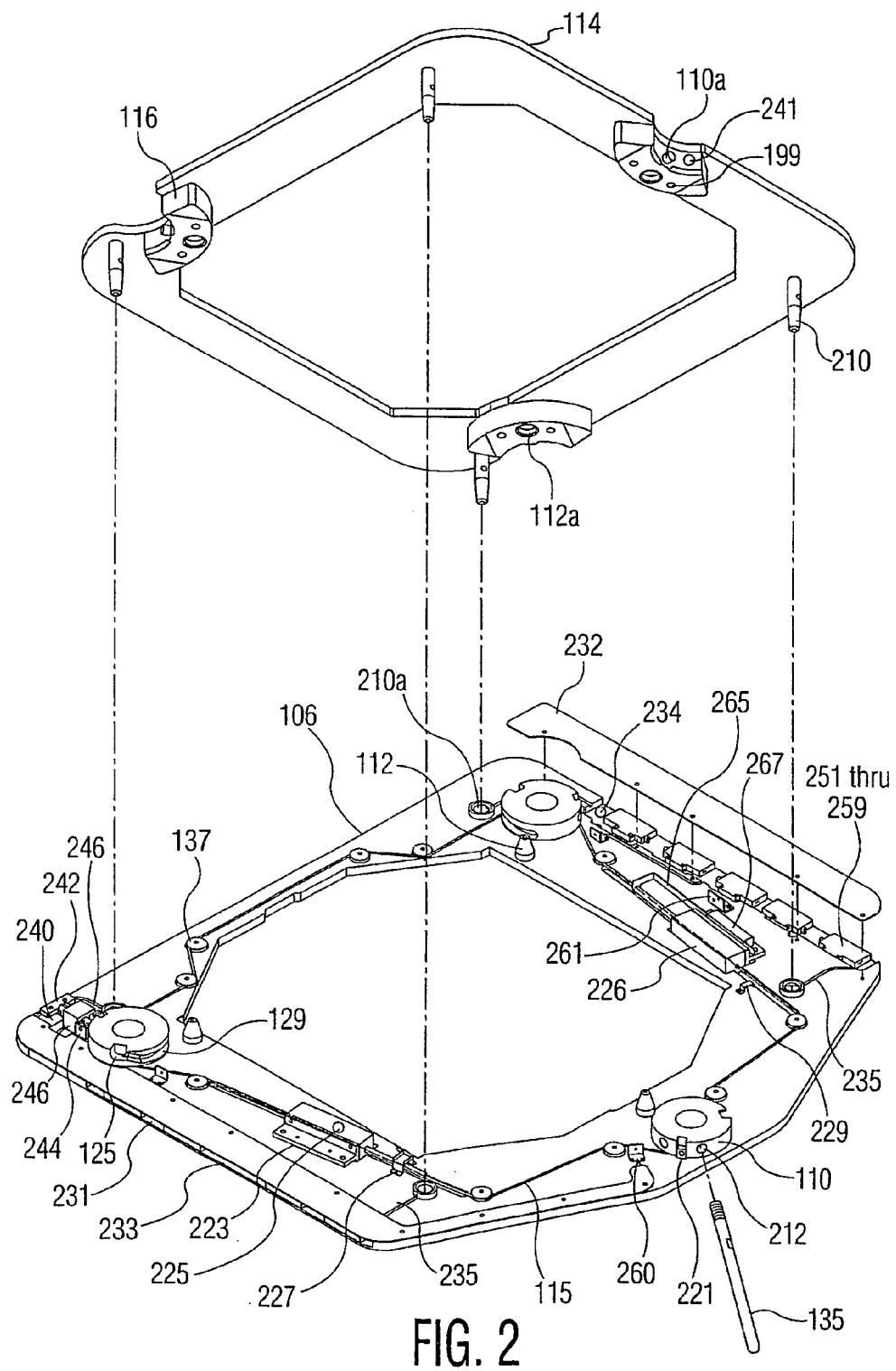
FIG. 2 is a perspective view of a docking apparatus according to the present invention.
Figure 3A:
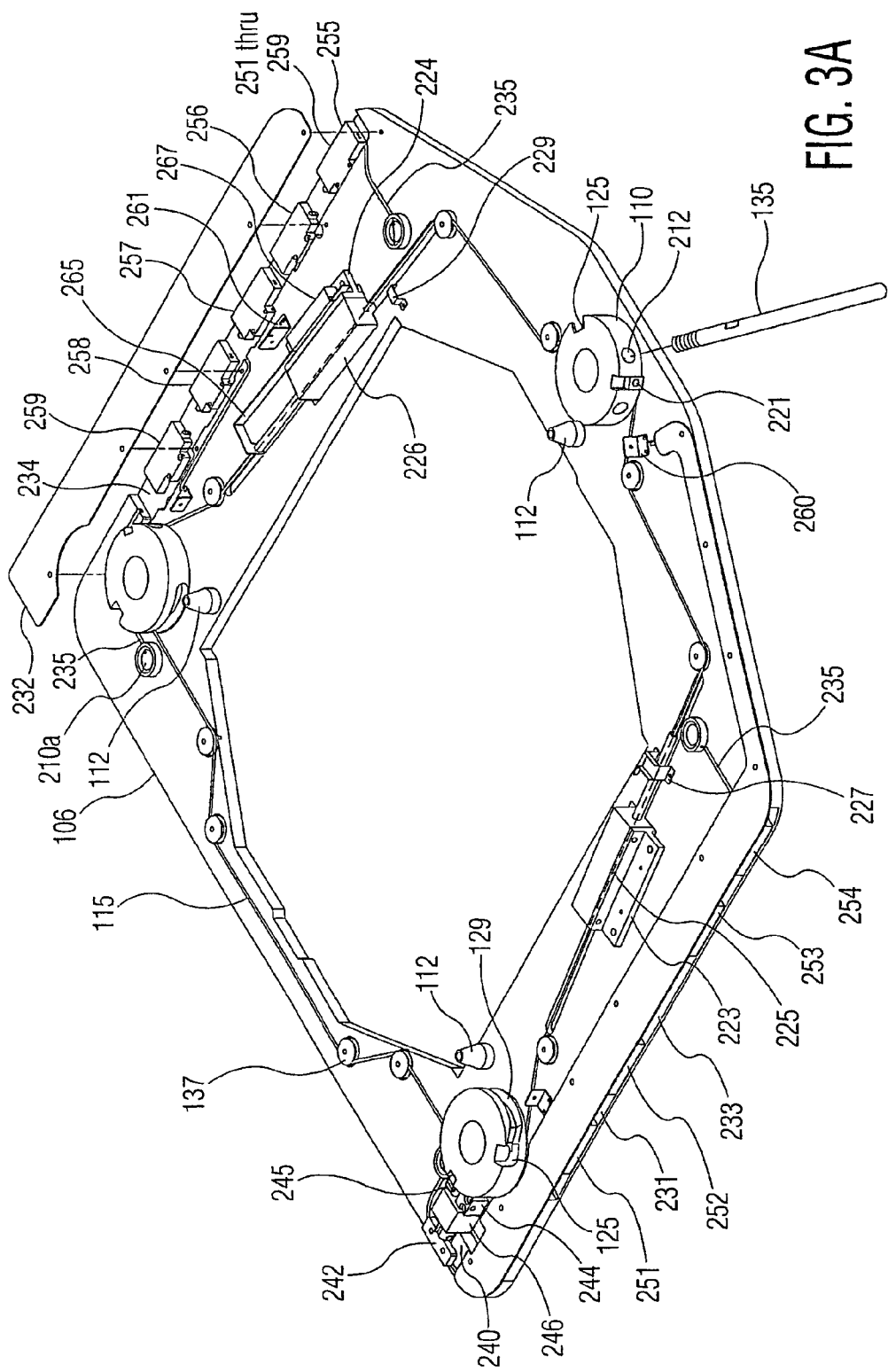
FIG. 3A is a perspective view of the test head side of a docking apparatus.
Figure 3B:
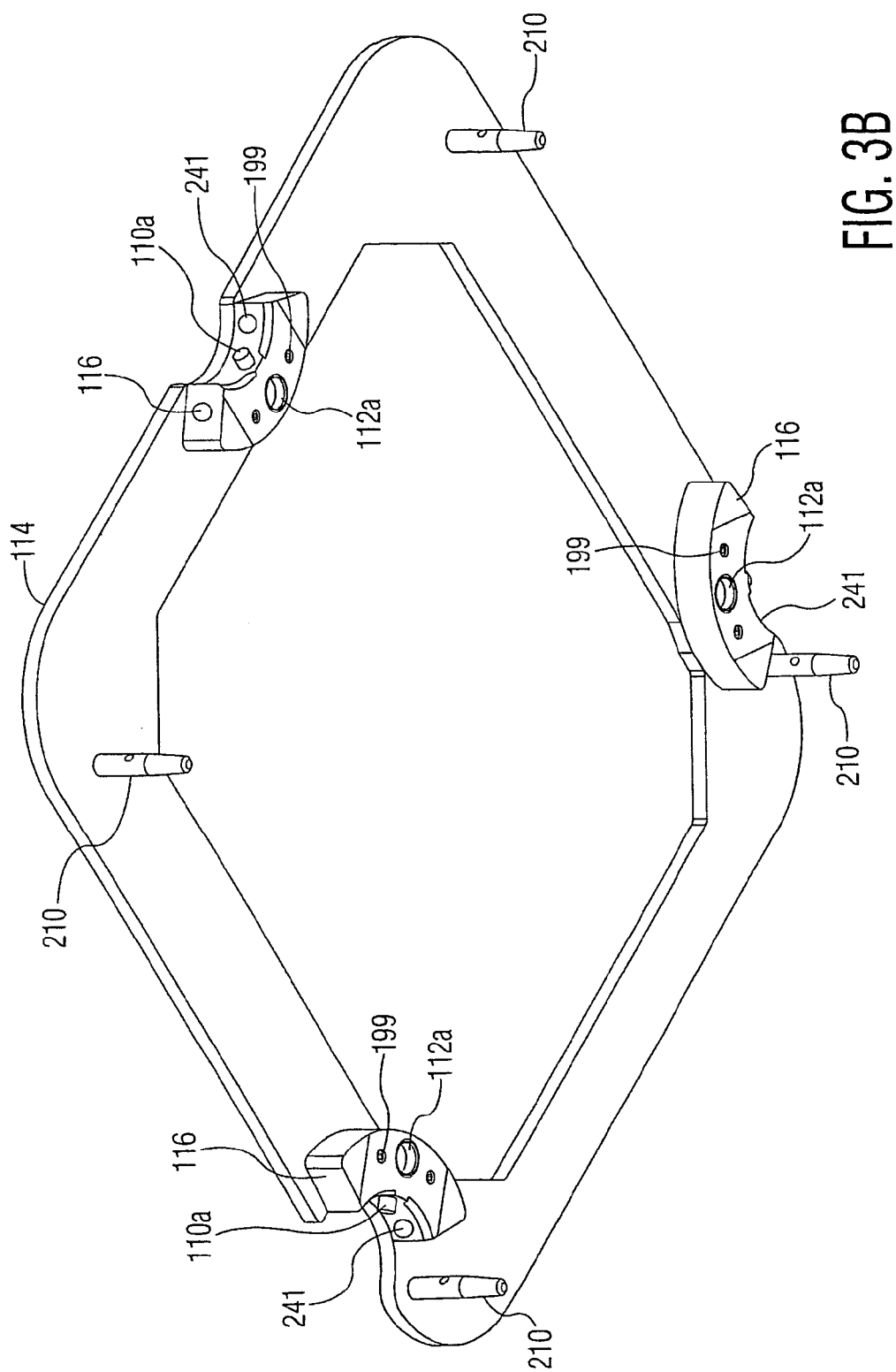
FIG. 3B is a perspective view of the handling apparatus side of a docking apparatus.

FIG. 2 is a perspective drawing of an improved dock in accordance with an exemplary embodiment of the present invention. FIG. 3A provides an enlarged view of the test head side of the docking apparatus illustrated in FIG. 2, and FIG. 3B provides an enlarged view of the handling apparatus side of the docking apparatus illustrated in FIG. 2. As in FIG. 1A, the docking apparatus in FIG. 2 includes gusset plate 114, which attaches to the handler apparatus, and face plate 106, which attaches to the test head. Three gussets 116 each having a guide pin receptacle 112a and a cam follower 110a are attached to gusset plate 114. For example, each gusset may be attached to gusset plate 114 using mounting screws 199. Correspondingly, three cams 110 and three guide pins 112 are arranged on faceplate 106. Accordingly, the docking apparatus shown in FIG. 2 is a three-point dock; however, the concepts to be described apply just as well to two-point, four-point or other configurations. Furthermore, the concepts to be described will also apply to docks having other arrangements of cams, including linear cams.

Both the face plate 106 and gusset plate 114 have central openings to accommodate the electrical interfaces (not shown) of the test head and handler apparatus respectively, as previously described with respect to FIGS. 1A through 1D. The guide pins 112 are disposed at the three corners of an approximate equilateral triangle whose center is located at the approximate center of the test head electrical interface. The locations of the cams 110, gussets 116, and guide pin holes 112a, are determined by the locations of the guide pins 112. In particular, each cam 110 is approximately centered on a line extending from the center of the aforementioned triangle through the guide pin and positioned further from the triangle's center than is the guide pin. As was described with respect to FIG. 1A, the gussets are shaped with a circular cut out 241 that is approximately concentric with the cam when the test head is fully docked, and a cam follower 110a is attached to the surface of each circular cut out 241 of each gusset 116. As is shown in FIG. 2, the gusset plate 114 has circular cutouts conforming to the gusset cutouts 241. Also, as described with respect to FIG. 1A, each cam 110 in FIG. 2 has a side helical groove 129 around its circumference with an upper cutout 125 on the upper face. Each gusset 116 has a guide pin hole or receptacle 112a bored in it.

Also in FIG. 2, each guide pin hole 112a corresponds to a respective guide pin 112. These are arranged so that when the test head is fully docked, each guide pin 112 will be fully inserted into its respective guide pin hole 112a. The fit of each guide pin 112 in its corresponding hole 112a is a close fit. Thus, the guide pins 112 and guide pin holes 112a provide alignment between the test head 100 and the handler apparatus 108.

Continuing with FIG. 2, each cam 110 has one or more threaded holes 212 in its side. One or more docking handles 135 are made from suitable rod and threaded on one end so that each may be attached to a cam 110 by screwing it into an appropriate hole 212. In this way the docking handles 135 may be readily removed or relocated as best fits a particular application. The arrangement in FIG. 2 does not have a cam driver; however, alternative arrangements incorporating a cam driver are readily possible.

Four coarse alignment pins 210 are attached near the four corners of gusset plate 114. Four coarse alignment guide holes lined with bushings 210a are disposed at corresponding locations on face plate 106. The coarse alignment pins 210 fit very loosely into the corresponding coarse alignment bushings 210a. The coarse alignment pins 210 are longer than the height of the cams 110. Consequently, the insertion of the coarse alignment pins 210 into their corresponding bushings 210a provides a first coarse pre-alignment of the test head with the handler apparatus. It is to be noted that a docking apparatus need not have this feature in order to benefit from other aspects of the present invention. It is also to be noted that both guide pins 112 and the coarse alignment pins 210 perform alignment functions and, in general, both may be termed "alignment pins." The term "alignment pin" is used herein to refer to alignment features such as guide pins and course alignment pins.

Another problem overcome by the present invention is the increasing docking force required for larger test heads. As the test head is docked, electrical connectors are engaged and resilient contacts such as pogo pins are compressed. For situations requiring the connection of several hundreds or thousands of electrical contacts, the direct force required can be up to one-thousand (1000) or two-thousand (2000) pounds. The dock actuator, whether manual or powered, must overcome this force as well as the force necessary to move the test head and overcome any compliance mechanisms. The actual force that must be applied by the actuator is the foregoing direct force divided by the mechanical advantage of the actuation mechanism. In docks having circular cams for example, the mechanical advantage is determined in part by the slope of the cam groove 129. It is possible to provide a cam groove 129 with a non-constant slope so that mechanical advantage changes as a function of cam position. This may allow for a dock which requires an approximately constant actuator force over the range of motion in situations where the direct force to be overcome varies with the separation between electrical interfaces. If the dock is manually powered, then the length of the handle is also considered in determining the mechanical advantage. If a cable driver 132 is used, then the ratio of the diameter of the cable driver 132 to the diameter of the cams 110 is a further factor in determining the mechanical advantage. As test heads grow larger and heavier with an increasing number of contacts, it becomes more and more of a problem to provide a manually operated actuator.

One or more, and preferably two or more, linear double acting pneumatic actuators 225 and 226 are attached to face plate 106 by means of support brackets 223. Air used by actuators 225 and 226 may be delivered by an air hose held in place by air hose clips 227 and 229. The actuators 225 and 226 may be of the type having a piston which moves along a cylinder which has closed ends. Air can be injected or vented from either side of the piston to produce a force to move it in either direction. The piston is mounted in a central location on a rod that is coaxial with the cylinder and that extends through each end of the cylinder. Attached to each end of the rod is docking cable 115. The docking cables are led around pulleys 137 as necessary and attached to docking cams 110 by means of cable fasteners 221. Turnbuckles (not shown) may be incorporated in known ways to apply appropriate tension in docking cables 115. Thus, each cam 110 is attached to at least one pneumatic actuator 225 or 226. When the actuators are activated by applying air pressure they apply tension in docking cables 115 which in turn applies rotational torque to cams 110. Notice that since the overall length of either of the two cables 115 is approximately ⅓ to ⅔ of the total cable length that would be necessary without actuators 225, overall cable stretching is thereby reduced.

By controlling, with a regulator for example, how much air pressure is applied to actuators 225 and 226, the amount of force applied to docking cables 115 and consequently the amount of torque that is applied to cams 110 is controlled. If a relatively low amount of pressure is used, the applied torque will not be sufficient to operate the dock against the docking force; however, the applied torque will reduce the amount of force that the operator is required to apply to docking handle 135 to operate the dock. In this case, the dock is manually operated with assistance. Thus, the dock may be partially powered to assist manual operation. Manual docking has the advantage of providing the operator with a degree of tactile feedback so that he or she can feel when docking or undocking is completed or, more importantly, whether any obstructions or malfunctions occur. This has a further advantage of simplicity and lower cost. However, as discussed earlier, as test heads become larger and heavier with more and more electrical contacts, providing reasonable manual operation is difficult to achieve. It would be desirable to retain the simplicity and proven alignment techniques of these manually operated docks in a powered dock.

The amount of assistance is controlled by controlling the applied air pressure. In a given application, it is desirable to adjust the air pressure to an amount that makes it relatively easy for the operator to actuate the dock, and low enough so that some tactile feedback is provided. On the other hand, by using an air pressure that is high enough, the docking can be performed fully automatically without operator force. In this case, it is desirable to use an air pressure that is sufficient to operate the dock, but low enough to prevent damage in case of any obstructions or malfunctions. A further advantage of this arrangement is that the dock may always be operated by hand in case of the loss of air pressure or certain emergencies. However, the operator may have to exert considerable force to do so.

As such, by controlling the applied air pressure, the docking system may be either a fully powered or partially powered system.

In various exemplary embodiments of the present invention, only partially powered assistance, as opposed to complete powered assistance, is provided in bringing together the test head and the handling apparatus. For example, the "only partially" powered assistance may be provided by one or more power driven actuators. As indicated above, in certain situations, it may be desirable to have an operator provide assistance in bringing together the test head and the handling apparatus. For example, for safety and other reasons (e.g., at the discretion of the operator), it may be desirable to have an operator start the motion of a handle that commences bringing together the test head and the handling apparatus. In another example, it may be desirable to have an operator supervise the powered actuator(s) bringing together the test head and the handling apparatus (e.g., to ensure that contacts mate properly without obstruction). As such, the term "only partially" powered assistance indicates that an operator is involved in the bringing together of the test head and the handling apparatus; however, the involvement of the operator can range from minimal (e.g., supervision) to a more integral involvement (e.g., turning an actuation handle).

In another example, if the air pressure provided is below a certain threshold pressure, an operator is required to provide some manual assistance to actuate the dock (an "only partially" powered system). Alternatively, if the air pressure is above a certain threshold pressure, the dock may be fully powered, requiring no operator assistance. As such, a system may be either "only partially" powered or fully powered, depending upon the air pressure provided; such a system may be termed "at least partially" powered because the system may be operated as either fully or only partially powered, depending upon the air pressure supplied.

In some testing systems, it is desirable to ensure that once the test head is docked that it is mechanically locked in place so that it will not move or become undocked unexpectedly. FIG. 2 includes latch assembly 240, which operates on the cam 110 that is located in the left hand corner. Latch assembly 240 includes cam lock lug 242, latch 245 latch support 244, latch slot 247 (shown in FIG. 5A), and pneumatic cylinder 246. When the cams 110 have been fully rotated into the fully docked and latched position, the air cylinder 246 may be pressurized by the operator or the controller to urge latch 245 into mating latch slot 247 in the cam, which serves to lock it in position until it is released. The pneumatic cylinder 246 may be double acting, requiring air actuation to both engage and release the latch. Alternatively, the latch 245 may be spring-loaded and a single action cylinder may be used. This may be achieved in either of one or two ways. In the first method, the spring exerts a force in a direction to unlatch the latch 245, and a single-acting pneumatic cylinder remains pressurized to keep the latch 245 latched. Releasing the air pressure allows the latch 245 to unlatch under the force of the spring. In the second method, the spring exerts a force to urge the latch 245 into the latched position, and air pressure is provided to unlatch latch 245. The second method is generally preferred because the latch will remain latched if power or air pressure is lost.

Sensors are incorporated in the docking apparatus of FIG. 2. The outputs of the sensors may be connected to appropriate inputs of a system controller (not shown), which may also control other functions of the positioning system, including, for example, the control of selected manipulator motion axes. In overview, coarse alignment sensors are provided that detect the presence of each coarse alignment pin 210 in its corresponding coarse alignment guide bushing 210a; ready to actuate sensors detect when each cam follower 110a is fully inserted in its corresponding cut out 125 in its corresponding cam 110; and actuator position sensors detect the rotational position of the cams 110. In another embodiment of the invention, coarse alignment pins 210 may be eliminated, and other means of coarse alignment sensing, such as sensing of the entry of the tip of guide pins 112 into their respective receptacles 112a, can be substituted.

In the exemplary embodiment shown in FIGS. 2, 3A, and 3B, the sensors are all of the same type, which is a reflective optical sensor that detects the presence or absence of a reflected beam of light. Such sensors are available from Keyence Corporation of America, Woodcliff Lake, N.J. In particular, Keyence model FS-V11 and FS-V11P "Amplifiers" and Keyence type FU-35FZ "Reflective Fiber Units," equipped with F-2HA focusing lenses are used in the exemplary embodiment. Keyence publications FSG-KA-C3-3-0201 and FSV10-KA-C-3-0201 (both printed in Japan) provide information on these devices. One sensor consists of one Amplifier coupled to one Reflective Fiber Unit; and Keyence, Corp. refers to this combination as a "Fiber Optic Sensor." In brief summary, a Reflective Fiber Unit includes a small sensing head attached to one end of a fiber optic cable with parallel paths for incident and reflected light. The other end of the fiber optic cable is coupled to the Amplifier.

A light emitting diode inside the Amplifier generates light, which is transmitted through the fiber optic cable to the sensing head where it is emitted in a narrow beam. The emitted beam of light is transmitted through space and reflected off a suitable target. The beam may preferably be focused with a focusing lens; and hereinafter, each sensing head that is described includes a focusing lens, which is not shown in the figures. The reflected light is gathered by the sensing head and passed through the fiber optic cable back to the Amplifier where it is converted to an electrical signal and analyzed. The amplifier provides a binary output signal indicating the presence or absence of reflected light of sufficient intensity to exceed a preset threshold. Thus, the Amplifier may be conveniently located at a location that is remote to the small sensing head. The Amplifier unit may contain complex electronics and operator controls to tune an individual sensor to a specific application. The reflected spot size may be as small as a few thousandths of an inch providing precise detection capabilities.

Nine sensors of the type described above are used in the exemplary embodiment. Four amplifiers 251, 252, 253, and 254 are disposed in left amplifier recess 233 along the left side of faceplate 106 and covered protectively with left cover 231. The remaining five amplifiers 255, 256, 257, 258, and 259 are disposed in right amplifier recess 234 along the right side of faceplate 106 and covered protectively with right cover 232. Grooves (not all are shown) such as 235 into which the optical fibers fit are provided in faceplate 106 to protectively route the optical fibers to the sensing head locations.

Four coarse alignment sensors are used to sense the presence or absence of each of the four coarse alignment pins 210 in it respective bushing 210a. These four sensors utilize amplifiers 251, 254, 255, and 259. Three ready to actuate sensors are used to sense when each of the three cam followers 110a is fully inserted in its respective cam cut out 125 and its respective cam 110 is ready to be rotated. These three sensors utilize amplifiers 252, 253, and 258. The remaining two sensors are used to sense four regions of rotational position of cams 110; and these utilize amplifiers 256 and 257. Thus sensing is provided to indicate the following:

1. Coarse alignment of the test head with respect to the handler apparatus is detected when all coarse alignment pin sensors indicate that all four coarse alignment pins 210 have penetrated their respective bushings 210a, but none of the cam follower sensors indicate that any of cam followers 110a are fully inserted in their respective cam cut outs 125.

2. Ready to actuate condition of the dock when all cam follower sensors indicate that all cam followers 110a are fully inserted into their respective cam cut outs 125 in their respective cams 110.

3. Regions of cam rotation, for example: entry/exit and captured (combined), midway, docked, and docked and locked (combined).

Each of these is now explained in more detail below.

Figure 6B:
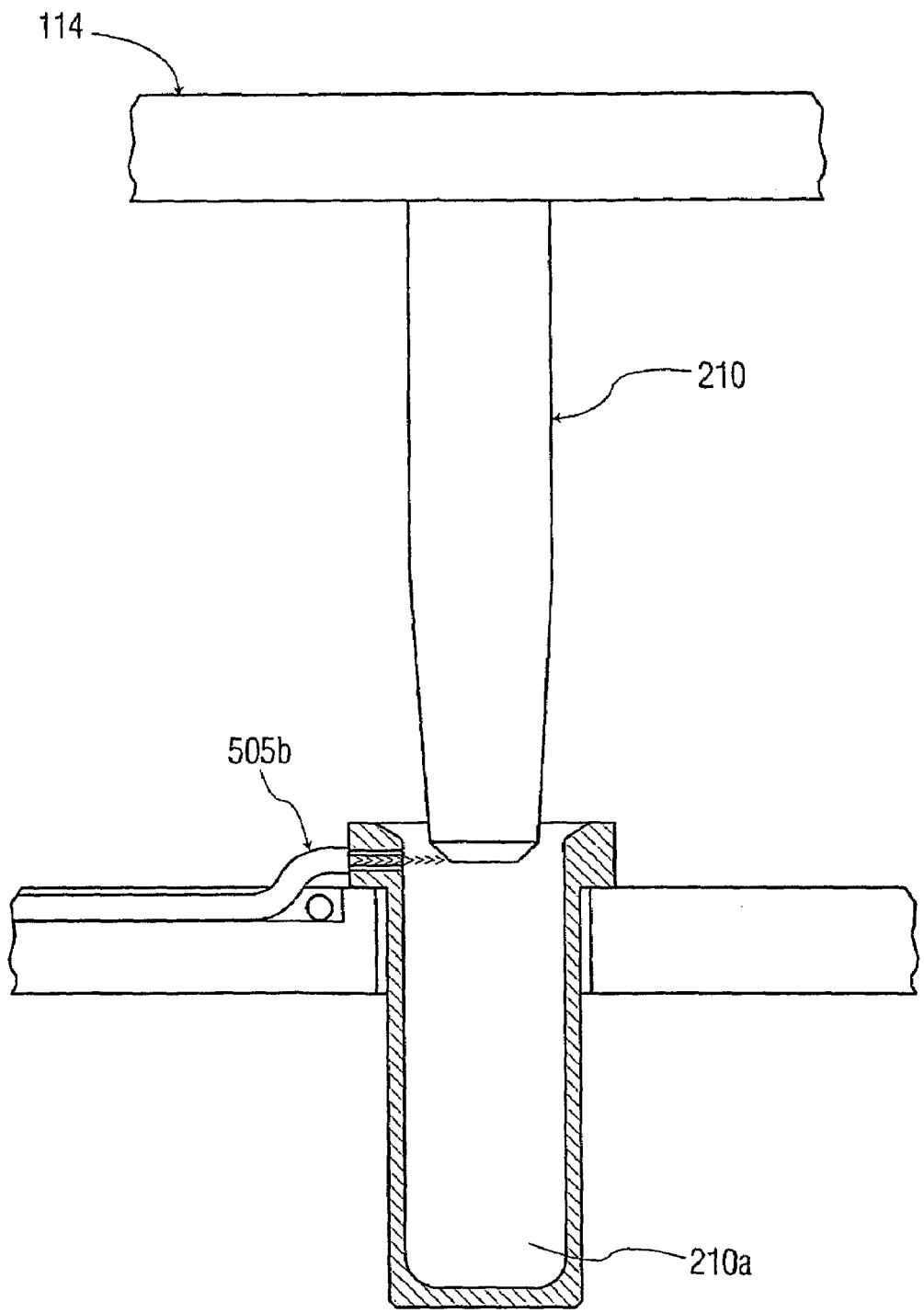
FIG. 6B is a cross section of a coarse alignment pin and guide bushing in a first coarse alignment position.
Figure 7B:
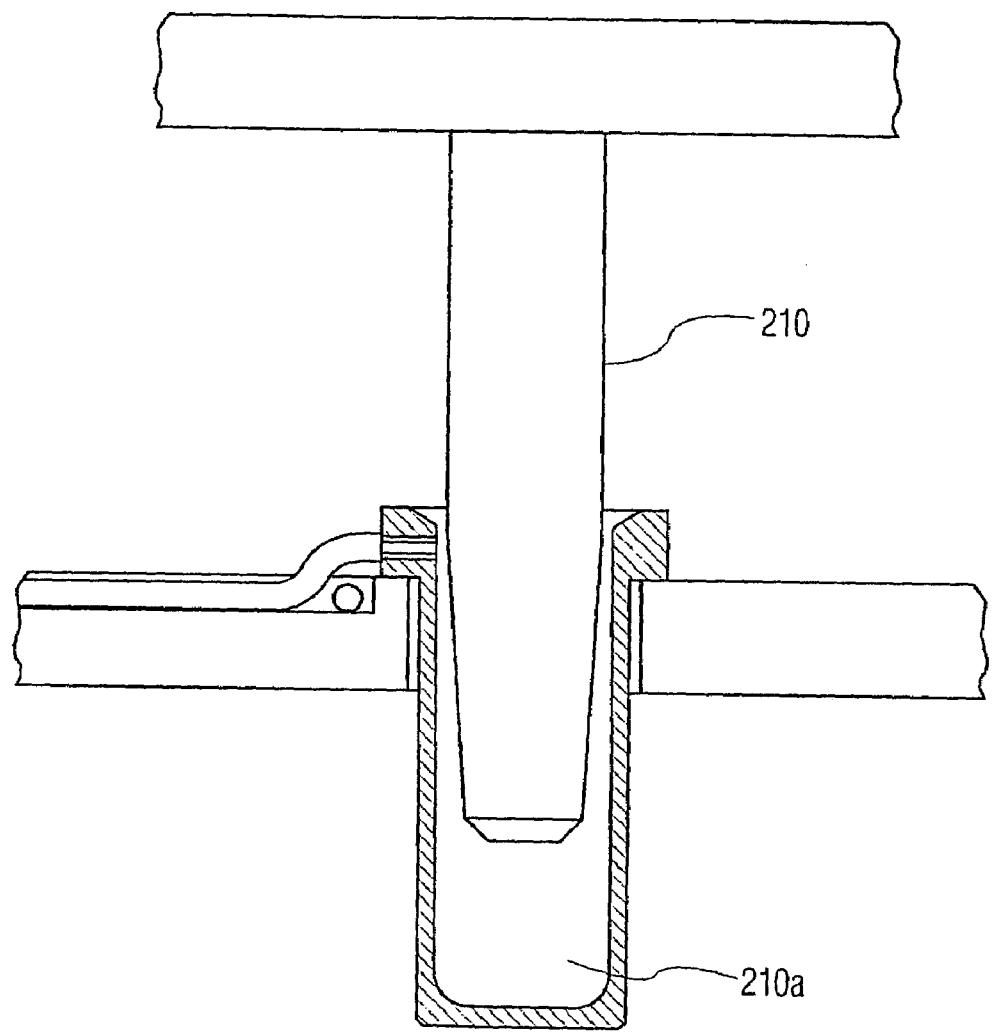
FIG. 7B is a cross section of a coarse alignment pin and guide bushing in a second coarse alignment position.

Coarse alignment sensing is first discussed. FIGS. 5B, 6B, and 7B are cross sectional views of a coarse alignment pin 210 and its corresponding guide bushing 210a in three sequential positions. For purposes of explanation, the coarse alignment pin 210 and guide bushing 210a on the left hand side of FIG. 2 is considered. Beginning with FIG. 5B, coarse alignment pin 210 is outside of guide bushing 210a. Fiber optic cable 501b in groove 235 in faceplate 106 is coupled to sense amplifier 251 (not shown here). Fiber optic cable 501b is also coupled to sensing head 505b, which is mounted in a hole bored through the lip of guide bushing 210a. Sensing head 505b and the corresponding amplifier are adjusted so that light beam 510 is emitted from sensing head 505b and crosses guide bushing 210a such that there is substantially no reflection returned. Beam 510b is approximately 5 mm below and essentially parallel to the plane defined by the opening at the upper end of guide bushing 210a. In FIG. 5B, amplifier 251 senses the absence of a reflected beam of light. In FIG. 6B the tip of coarse alignment pin 210 has been inserted into guide bushing 210a a small distance sufficient for it to reflect light beam 510b, causing the output of amplifier 251 to switch to a state indicating the presence of a reflected beam. Thus, the sensor detects that the coarse alignment pin 210 has entered the opening of its corresponding guide bushing 210a. In FIG. 7B, the coarse alignment pin 210 is more fully inserted into guide bushing 210a. The beam of light 510b remains reflected, and amplifier 251 continues to indicate the presence of the reflection. The remaining coarse alignment sensors are constructed and operate in essentially the same manner. When all coarse alignment amplifiers indicate the presence of reflection, all of the coarse alignment pins 210 have penetrated their respective guide bushings 210a, which indicates that coarse alignment has been achieved.

Although coarse alignment sensing is described in terms of coarse alignment pin 210 and bushing 210a, any type of alignment feature (optionally for being received by an alignment feature receptacle) can be sensed to determine one of several positions of alignment, such as a coarser one of two or more positions of alignment. In this way, coarse alignment sensors can be used to determine if the test head and the handling apparatus are positioned relative to one another in a coarser one of two or more positions of alignment.

Figure 8A:
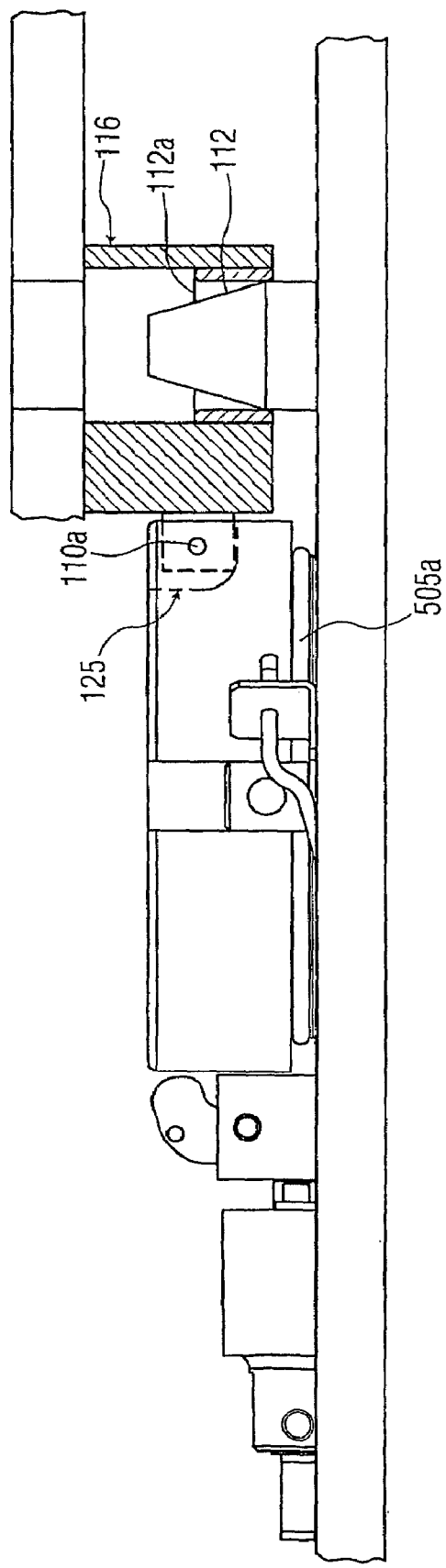
FIG. 8A is a cross section of a cam and gusset in a ready to actuate position.
Figure 9A:
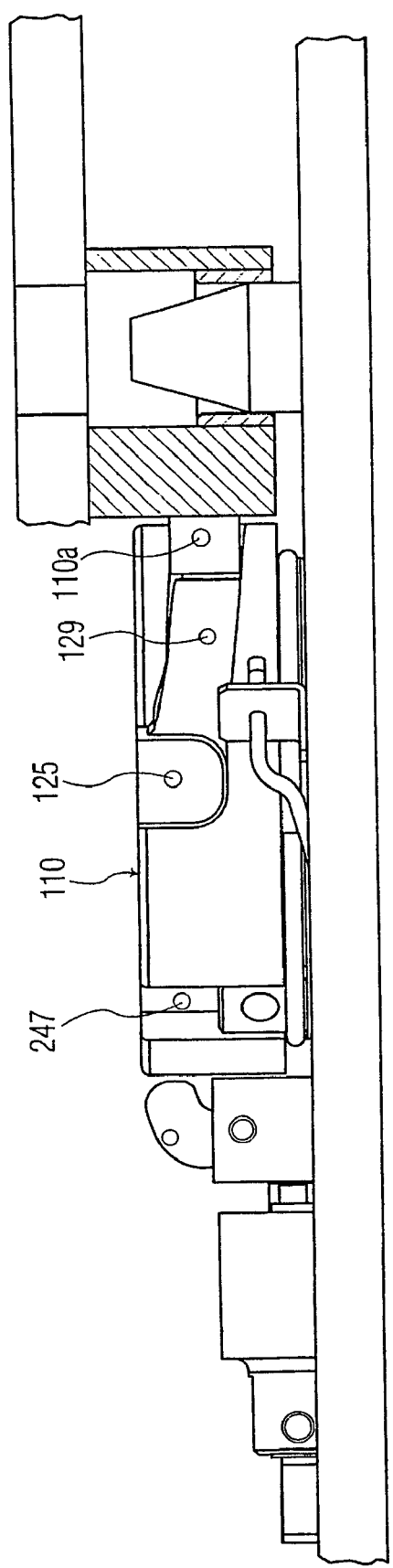
FIG. 9A is a cross section of a cam and gusset midway between a ready to actuate position and a fully docked position.

Ready to actuate sensing is now discussed. It is accomplished by detecting when the bottom edge of gusset 116 reaches a predetermined distance from faceplate 106. FIGS. 5A, 6A, 7A, and 8A are cross sectional views of a cam 110, cam follower 110a, guide pin 112, gusset 116, and associated items located on the left side of face plate 106. Also shown in cross section are components of lock assembly 240, which was discussed earlier. In FIG. 6A, gusset 116 and cam follower 110a are a distance away from cam 110. Sensing head 505a is mounted in a mounting bracket 260 (illustrated in FIGS. 2 and 3A), which is attached to faceplate 106. Fiber optic cable 501a couples sensing head 505a to amplifier 252 (not shown here, see FIG. 2). Sensing head 505a emits light beam 510a which passes in front of guide pin 112 such that no reflected light is returned to sensing head 505a. In FIG. 7a, cam follower 110a is partially inserted into cam cut out 125, gusset 116 is partially beside cam 110, and the tapered end of guide pin 112 is partially inserted into guide pin receptacle 112a. In FIG. 8A, the cam follower 110a is fully inserted into cut out 125 of cam 110. At this position the bottom edge of gusset 116 reflects the light beam 510a so that there is a presence of light reflected back to the sensing head 505a. Sensing head 505a and amplifier 252 are adjusted and calibrated so that the reflected beam is sensed by sensing head 505a and the amplifier provides an output indicating the presence of the reflected beam. Consequently, the output of amplifier 252 has switched to the state indicating the presence of reflected light. Here, the ready to actuate position has been achieved. Observe that at this point, the straight, constant-diameter, portion of guide pin 112 has just entered into guide receptacle 112a, providing close alignment. It is also observed that the height of sensing head 505a must be located appropriately with respect to face plate 106 and it is preferred that light beam 510a must be approximately parallel with faceplate 106. FIG. 9A illustrates the situation when the cam 110 has been partially rotated to a midway position. In particular, light beam 510a remains reflected, and amplifier 252 continues to provide a signal indicating the presence of the reflected beam of light.

Based on the above exemplary description, ready to actuate sensing can be described as detecting whether the test head and the handling apparatus are positioned relative to each other such that the actuation system (e.g., fully powered, at least partially powered, or only partially powered) is operable to bring the test head and the handling apparatus towards each other.

In another embodiment of the invention without coarse alignment pins 210, coarse alignment may, for example, be detected by mounting sensing heads at a height above the face plate 106 corresponding to the point where the bottom edge of the gusset 116 is at a height where the tapered tip of the guide pin is just inserted into its receptacle 112a. The corresponding sensing amplifiers could either be set up to recognize the reflection of light from the edge of the gusset 116, or to detect the absence of reflection of a beam from a convenient target due to its being interrupted by the gusset 116. The overall length and ratio of tip diameter to full diameter of guide pins 112 may be adjusted to provide a convenient detection distance from face plate 106 and a conveniently loose fit at the point of coarse alignment. It is noted that in some systems adequate performance can be achieved without incorporating coarse alignment sensors. In such cases the expense of the coarse alignment apparatus can thus be saved.

Figure 4:
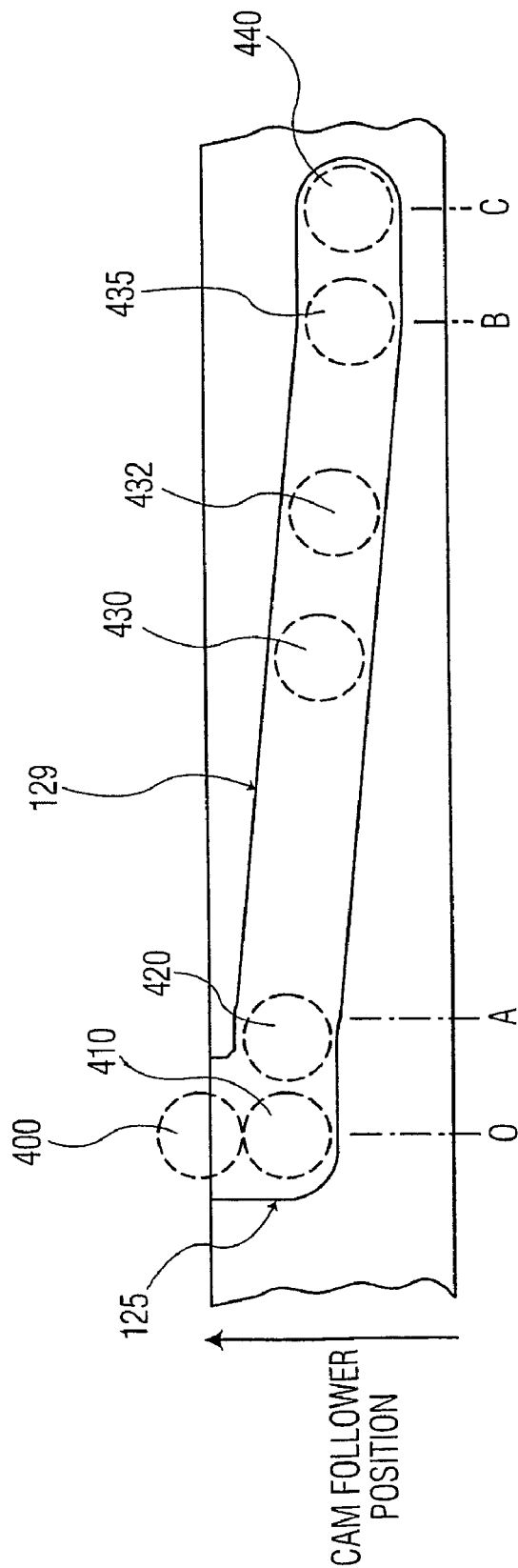
FIG. 4 is a not-to-scale diagram illustrating the vertical position of a cam follower vs. the angle of rotation of its cam of a prior art docking apparatus.

Cam rotation sensing is now described with the aid of FIGS. 2, 4, 12, 8C, 9C, 10C, 11C, and 12. FIG. 4, discussed earlier shows the cam follower 110a in various positions with respect to the cam grove 129 and cut out 125. several regions were defined including:

Entry/exit point where the cam follower 110a (illustrated as a dotted circle at various positions in cam groove 129) may enter and exit and move vertically in the cut out (positions 400 and 410), Captured region where the groove 129 is essentially parallel to face plate 106 (not shown in FIG. 4) between the entry/exit point and where the groove begins its slope (position 420), Midway region, where the groove 129 follows a slope along the periphery of the cam 110 (position 430). (Note that the midway region may be of constant slope; or, more generally, it may be of varying slope to best suit particular applications)

Docked region (position 435) at the bottom end of the slope, where the groove 129 is essentially parallel to face plate 106, Docked and latched point at the end of the groove 129, where the apparatus is in its final docked position (position 440). There may or may not be a detent in the groove at this point to give a feel of the dock clicking into final position.

Position 432 represents a predetermined "control position" whose location is selected by the designer according to particular needs of the application. Generally, the control position 432 is selected at a point between the captured region and docked and latched position 440. The region from the selected control position 432 to—but not including—position 440 is referred to as the "selected control region." Further aspects of control position 432 and the control region will be discussed later.

Figure 12:
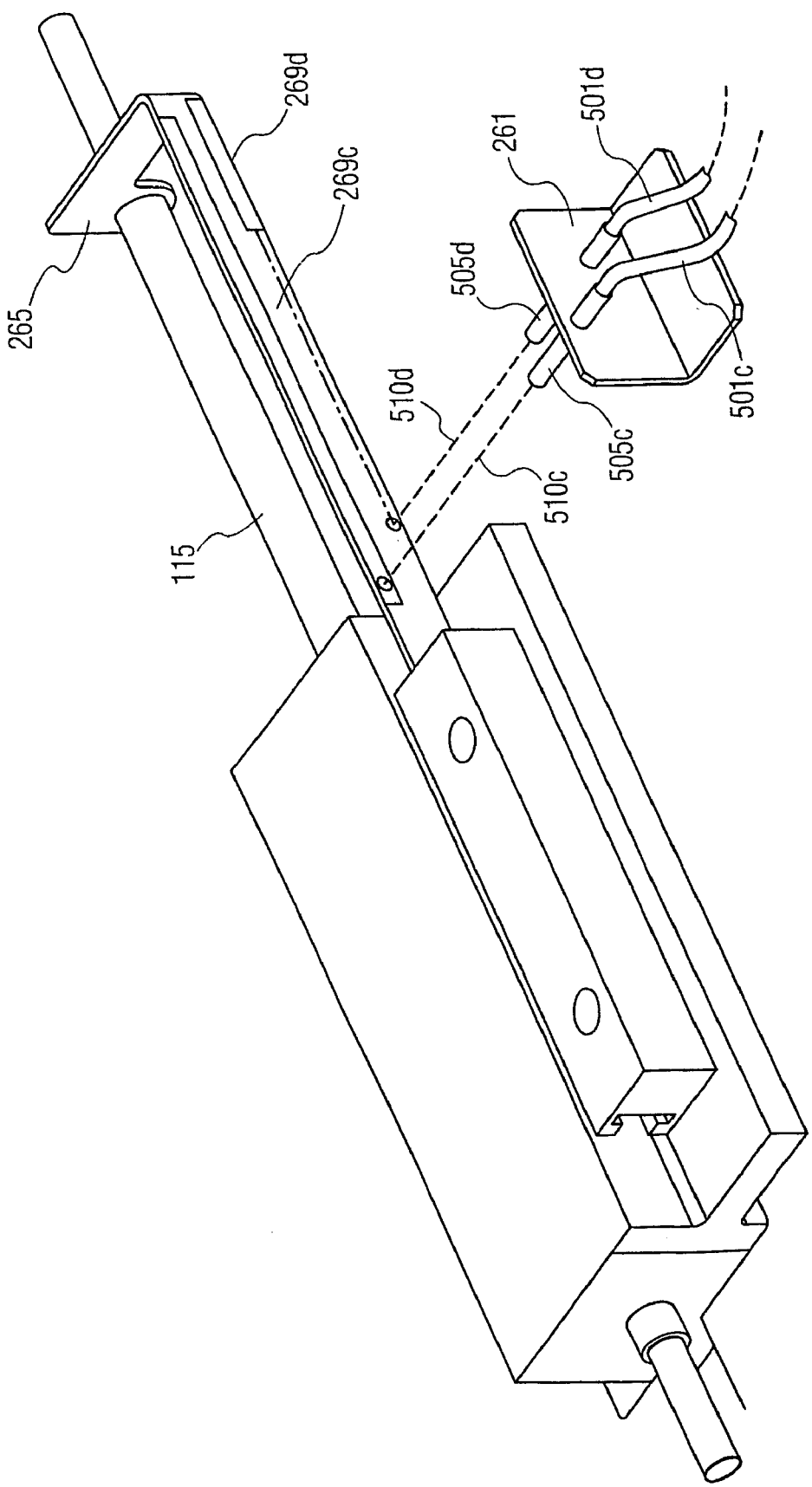
FIG. 12 is a perspective drawing of the essentials of the cam rotation position sensor apparatus.

FIG. 2 shows cam rotation sensor target 265 attached to docking cable 115. Target 265 straddles the right pneumatic cylinder 226 for convenience of location; in other configurations, this might not be necessary. Target guide 267 is attached to cylinder 226 to protect and to provide support for target 265. As the cams 110 rotate, the target 265 moves linearly with the accompanying cable motion. Sensing heads (not clearly visible in this view) of two reflective fiber units are mounted on cam rotation sensor bracket 261, and they detect reflective/non-reflective patterns (not visible in this view) on target 265 which indicate the position of the cams 110. FIG. 12 is a perspective view (not to scale) of the essential portions of the cam rotation sensing apparatus. In FIG. 12 there is cam rotation sensor bracket 261 supporting sensing heads 505c and 505d, which are spaced both horizontally and vertically apart from one another. Sensing heads 505c and 505d include focusing lenses (not shown). Sensing heads 505c and 505d are coupled to amplifiers 256 and 257 respectively (not shown in FIG. 12, see FIG. 2) by means of fiber optic cables 501c and 501d respectively. For example, the open end of fiber optic cable 501c at the bottom right portion of FIG. 12 leads to amplifier 256 (not shown in FIG. 12), and the open end of fiber optic cable 501d at the bottom right portion of FIG. 12 leads to amplifier 257 (not shown in FIG. 12).

Target 265 is made of a reflective material, preferably stainless steel, and it is fixedly attached to docking cable 115. Two non-reflective or light scattering strips 269c and 269d are attached to target 265 such that they are both parallel to cable 115. Strips 269c and 269d may be for example silk screened onto target 265; adhesive methods are also possible as are other techniques. The sensing heads 505c and 505d are positioned so that respective emitted light beams 510c and 510d are perpendicular to the target and at a vertical height corresponding to the vertical location of non-reflective strips 269c and 269d respectively. Thus, as the cable 115 moves the target back and forth, light beam 510c will in some regions strike and be reflected from the reflective surface and in other regions be absorbed or scattered by non reflecting surface 269c. Similarly, light beam 510d will in some regions strike and be reflected from the reflective surface and in other regions be absorbed or scattered by non reflecting surface 269d. For example, in the position shown in FIG. 12, beam 510c is striking non-reflective surface 269c while beam 510d is striking the reflective surface of target 265.

This arrangement, having two binary-valued sensing units, allows up to four regions or points of cam position to be sensed, which is sufficient for many applications. If more than four regions or positions are required to be sensed, then this arrangement may be expanded. For example, additional non reflective strips could be added to the target and additional sense heads and amplifiers added, each additional sense head and amplifier potentially doubling the number of regions and points that are detectable. Further alternative sensing means are mentioned later.

Figure 6C:
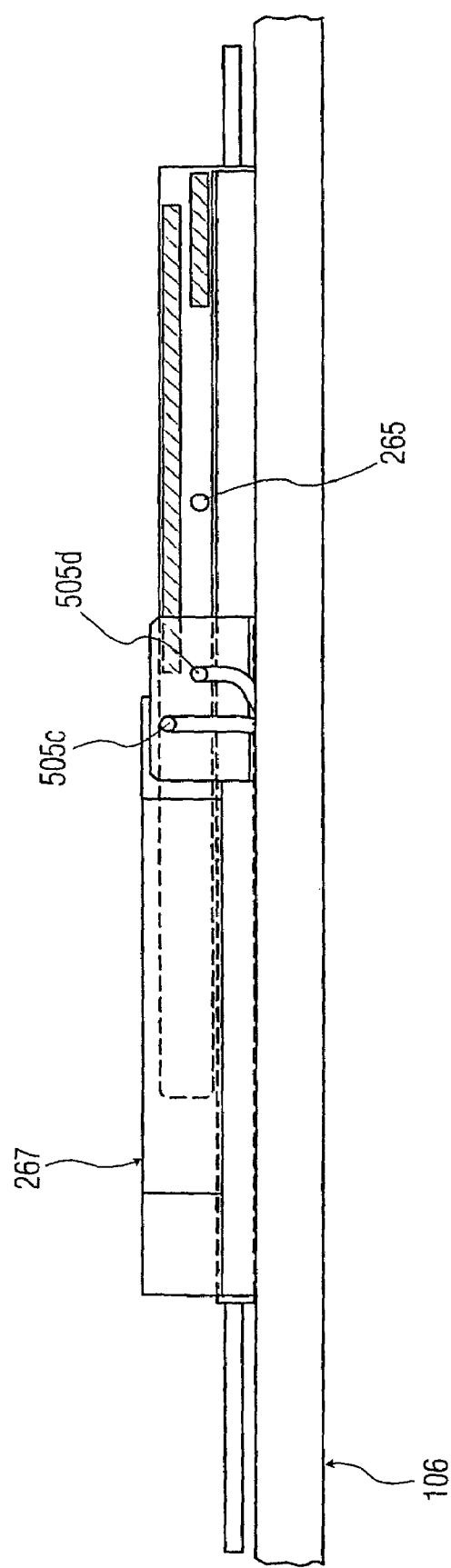
FIG. 6C is an elevation view of the cam rotation sensors and targets in a first coarse alignment position.
Figure 7C:
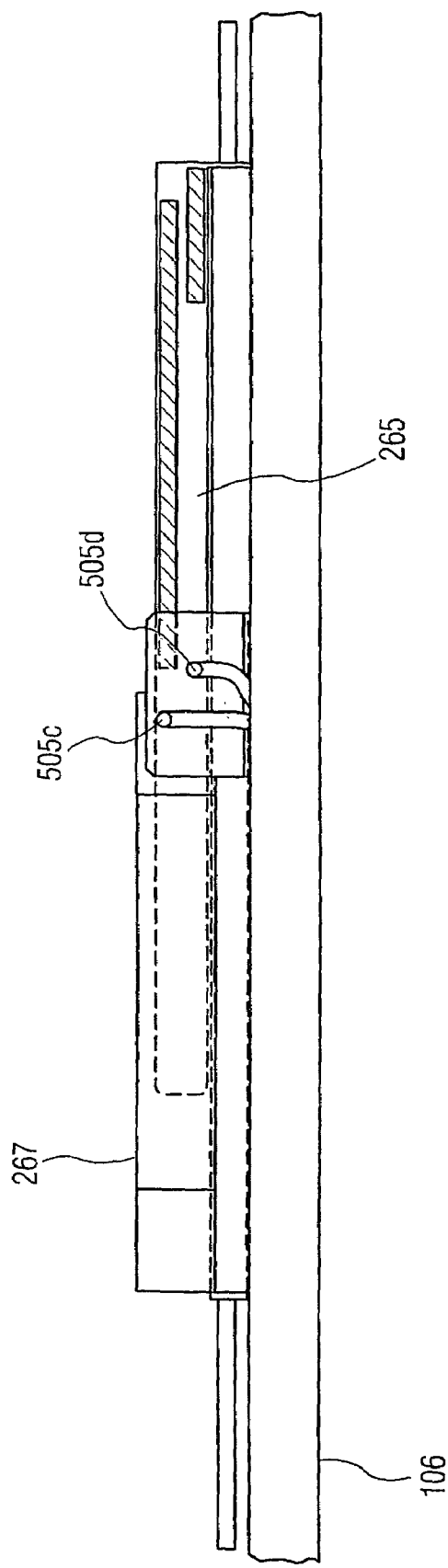
FIG. 7C is an elevation view of the cam rotation sensors and targets in a second coarse alignment position.
Figure 8B:
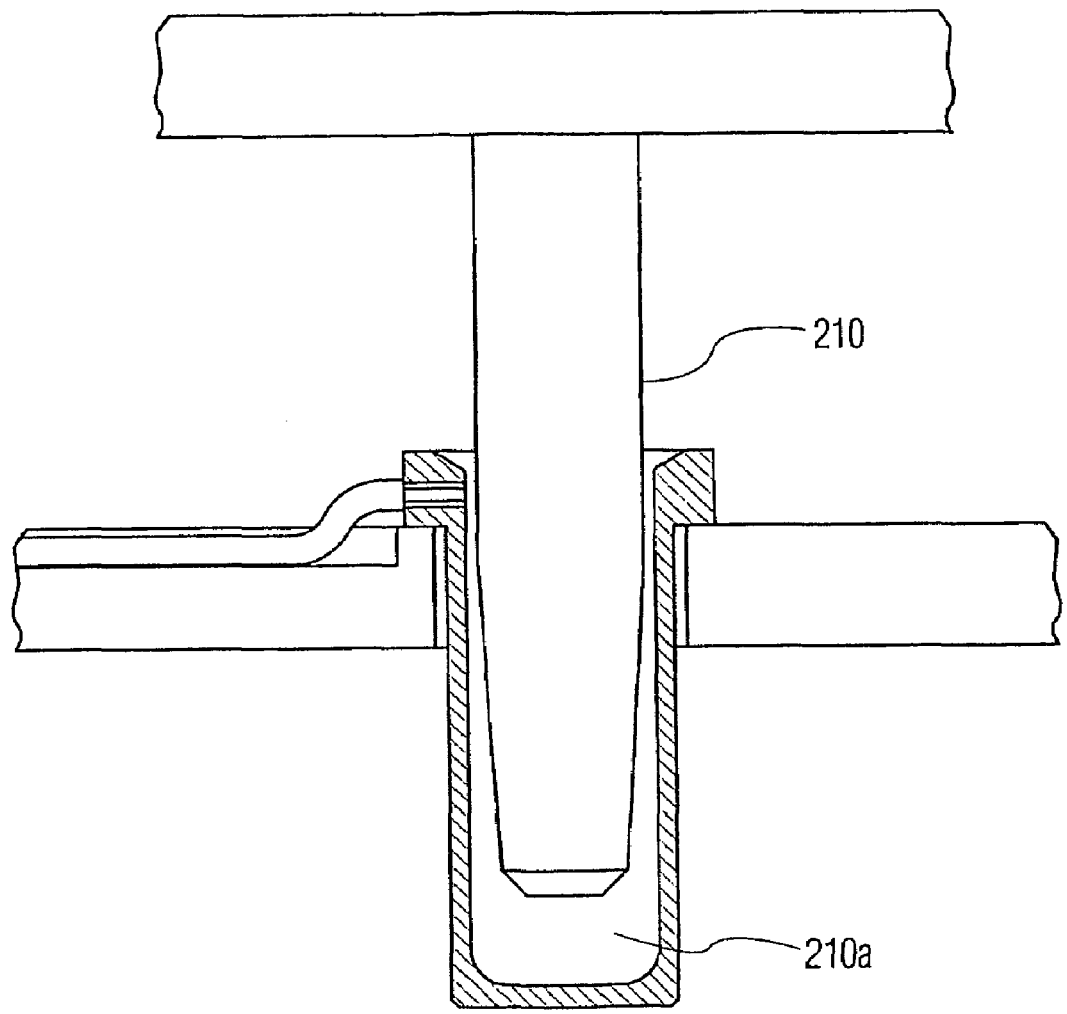
FIG. 8B is a cross section of a coarse alignment pin and guide bushing in a ready to actuate position.
Figure 8C:
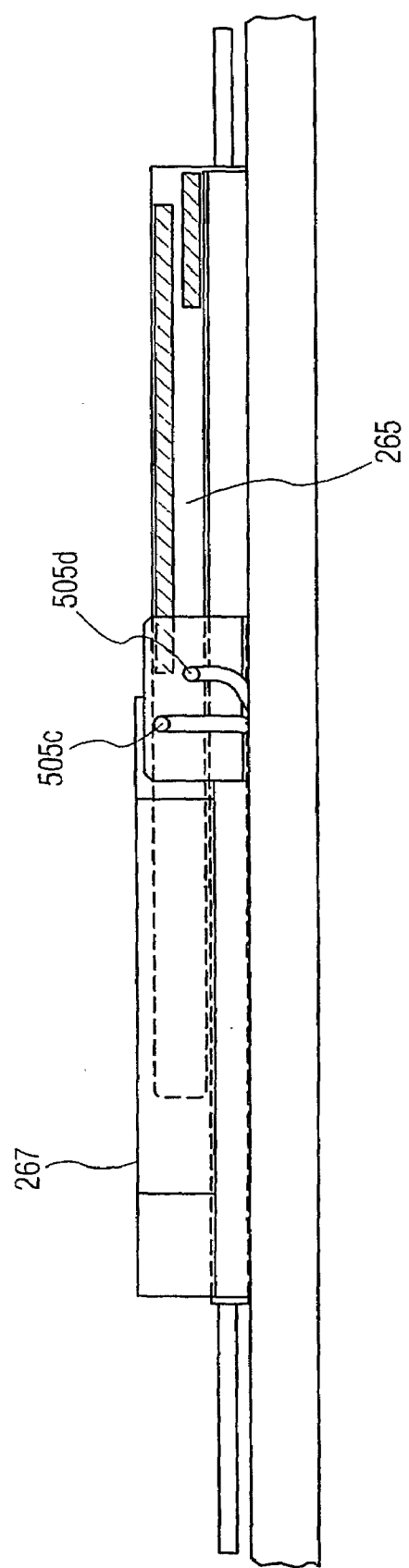
FIG. 8C is an elevation view of the cam rotation sensors and targets in a ready to actuate position.
Figure 9B:
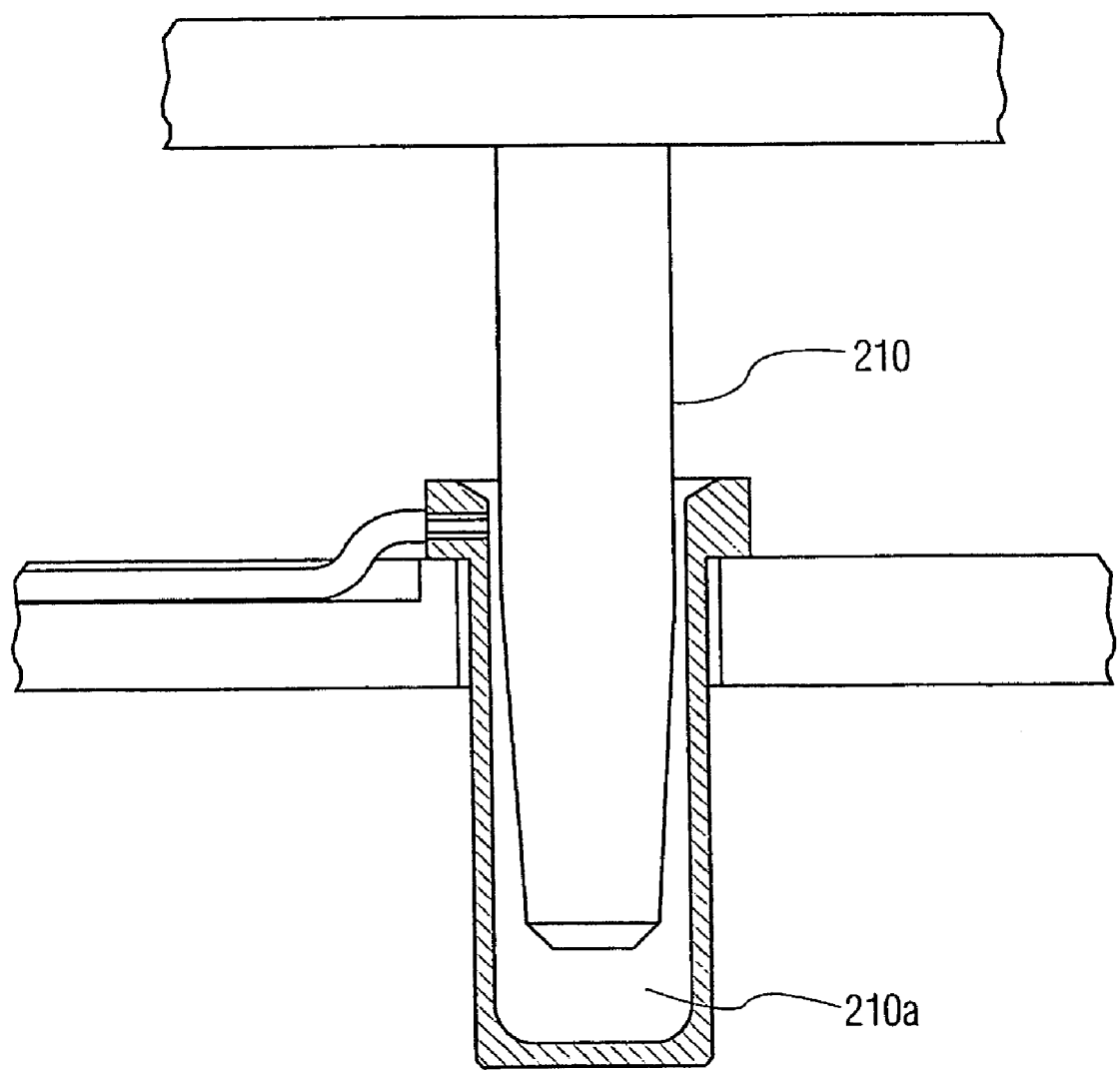
FIG. 9B is a cross section of a coarse alignment pin and guide bushing midway between a ready to actuate position and a fully docked position.
Figure 9C:
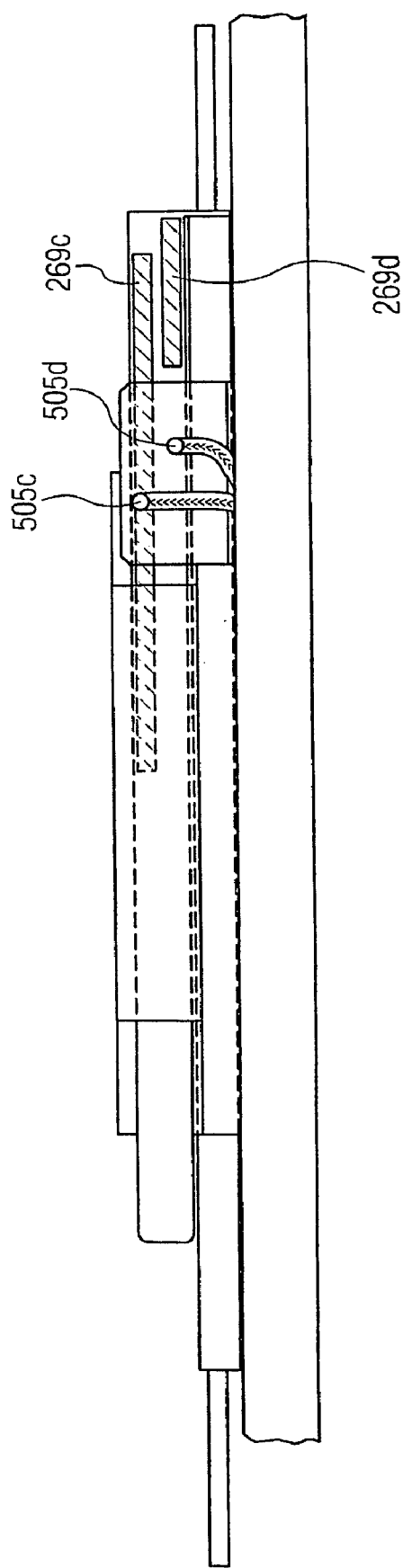
FIG. 9C is an elevation view of the cam rotation sensors and targets midway between a ready to actuate position and a fully docked position.
Figure 10A:
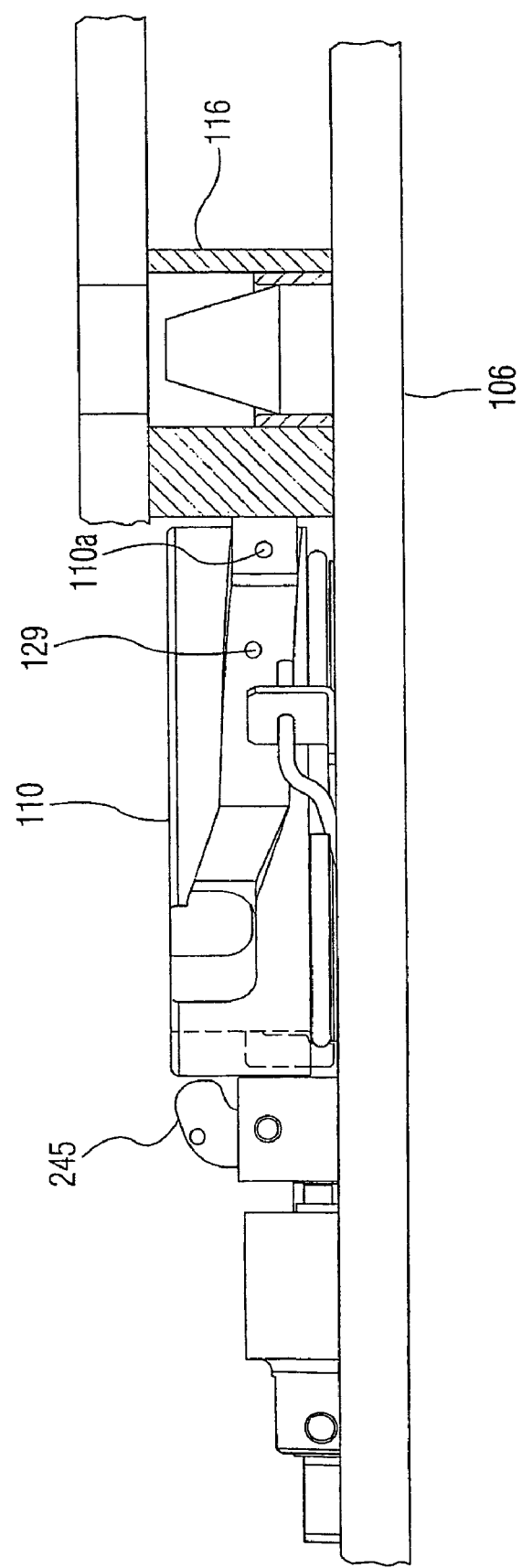
FIG. 10A is a cross section of a cam and gusset in a fully docked position.
Figure 10B:
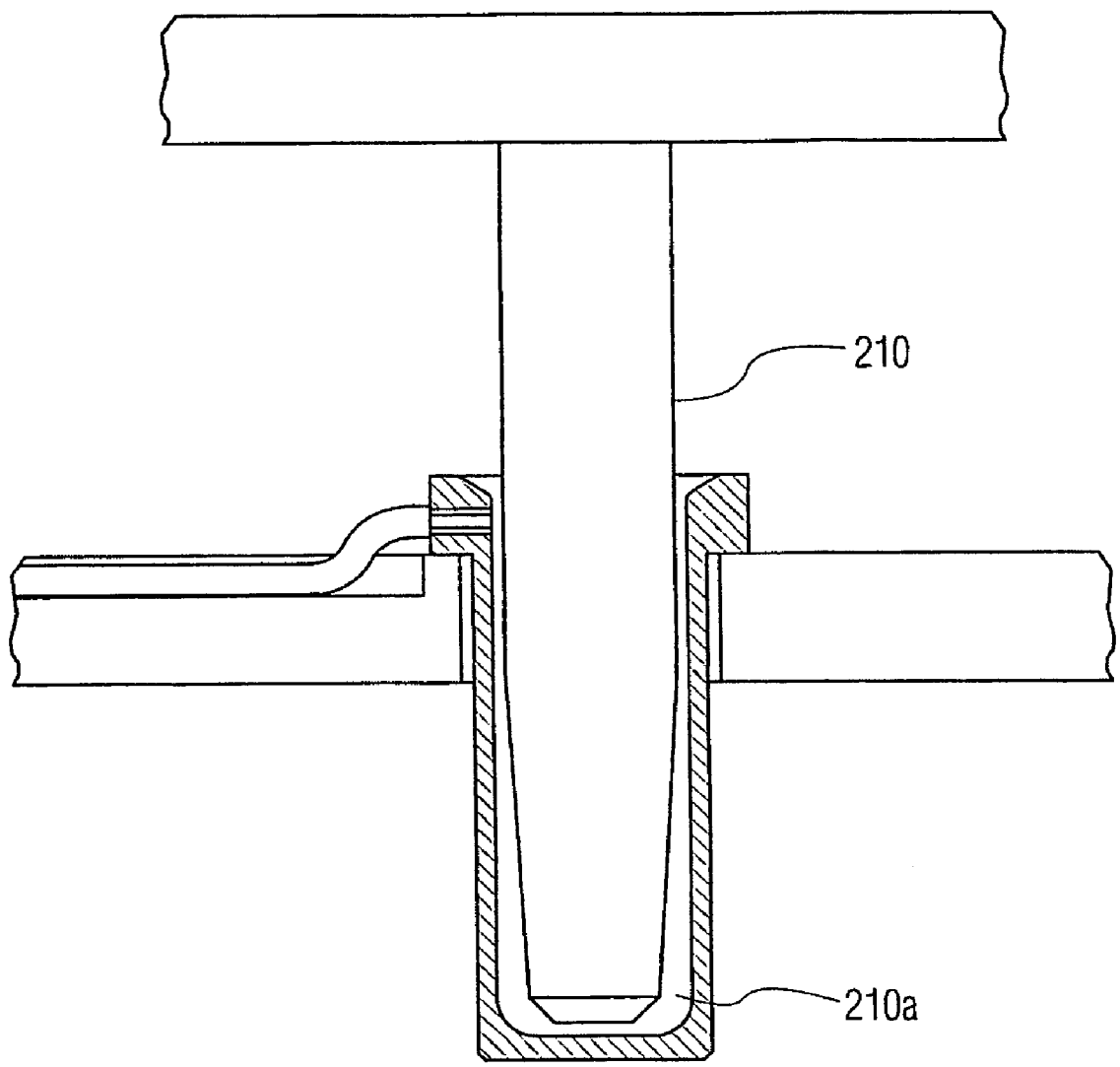
FIG. 10B is a cross section of a coarse alignment pin and guide bushing in a fully docked position.
Figure 10C:
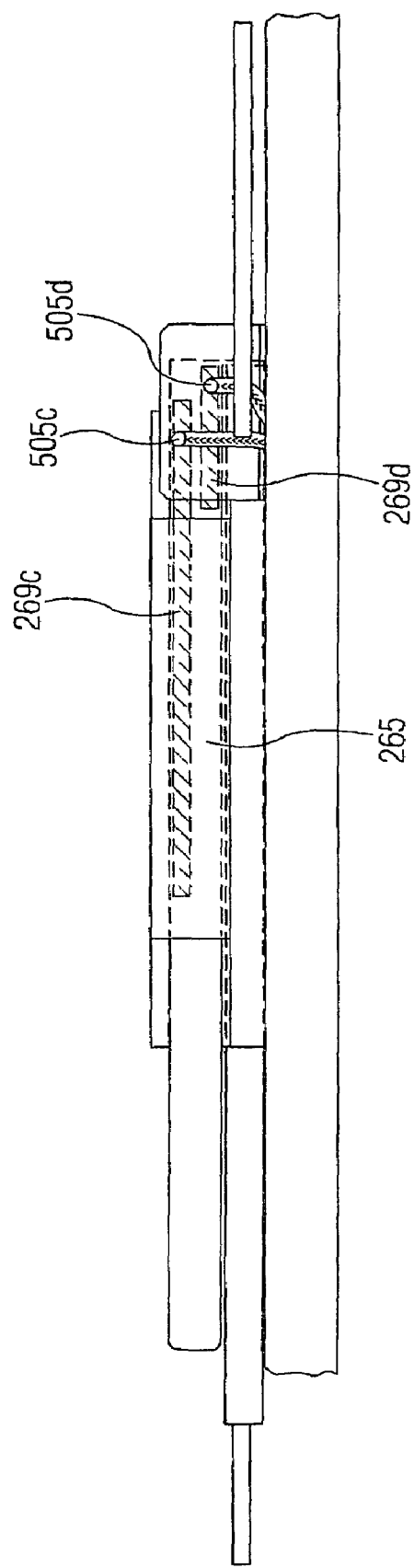
FIG. 10C is an elevation view of the cam rotation sensors and targets in a fully docked position.
Figure 11A:
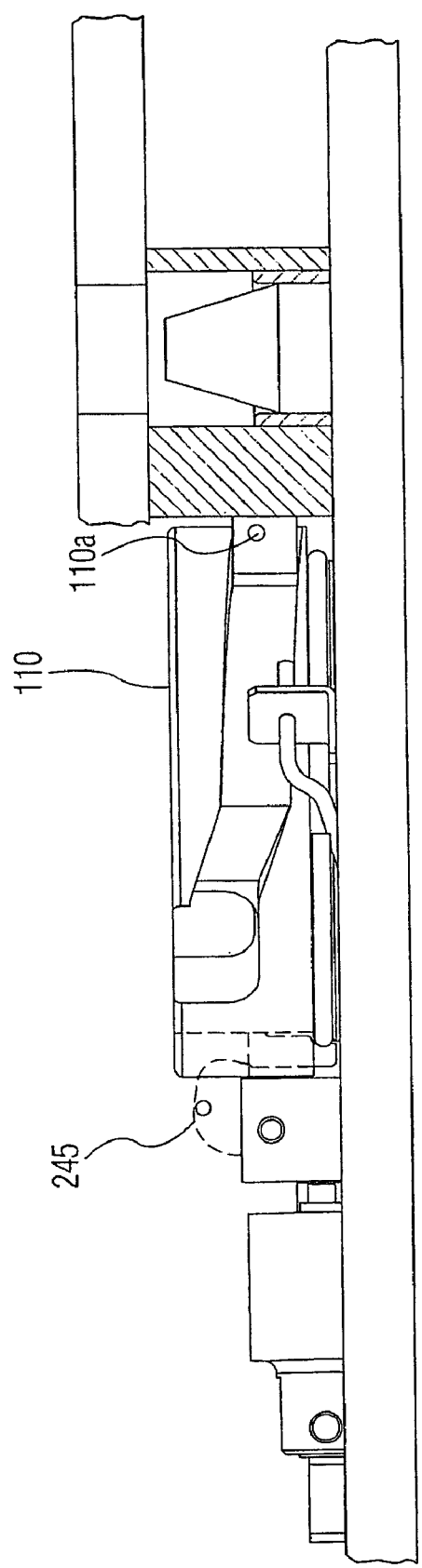
FIG. 11A is a cross section of a cam and gusset in a fully docked and locked position
Figure 11B:
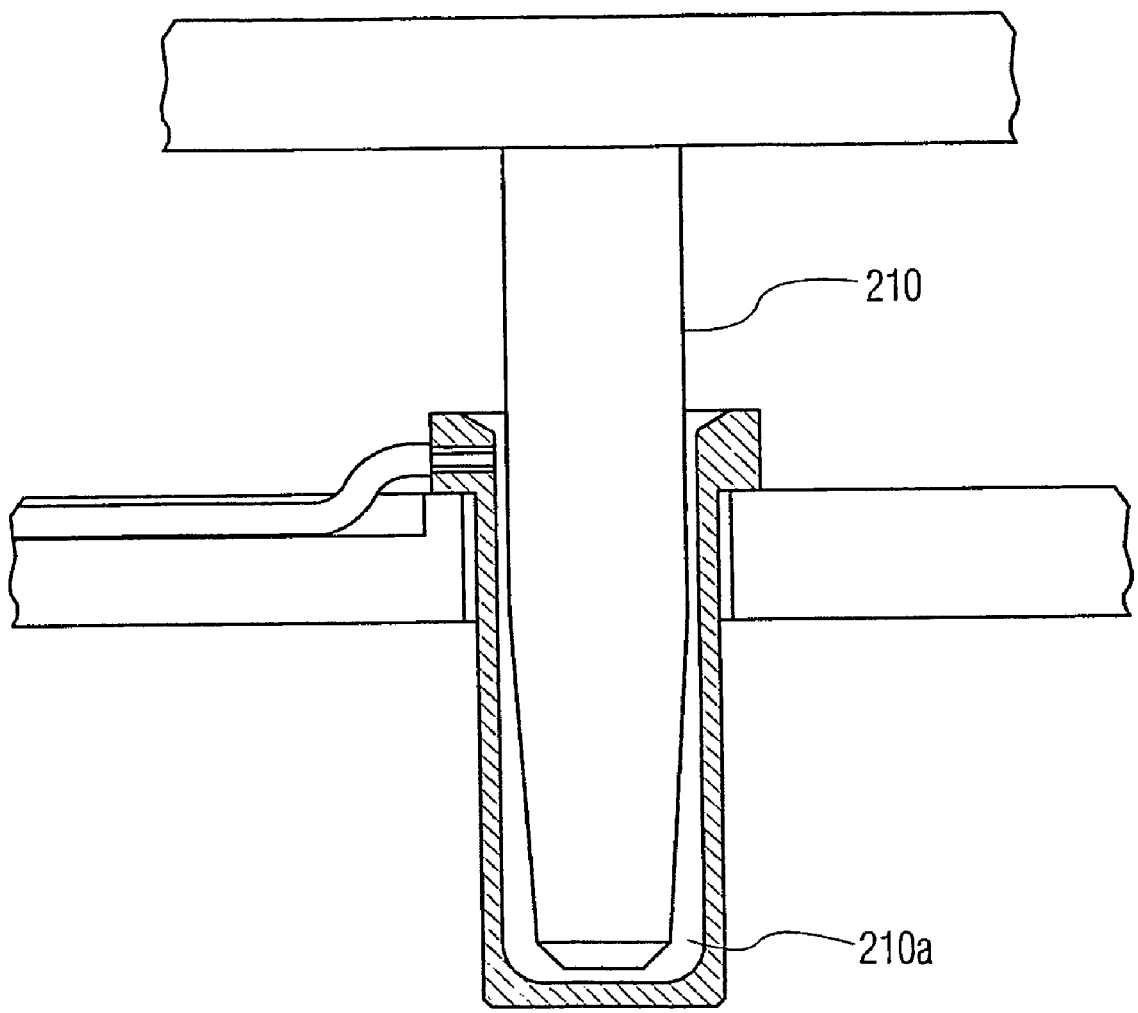
FIG. 11B is a cross section of a coarse alignment pin and guide bushing in a fully docked and locked position.
Figure 11C:
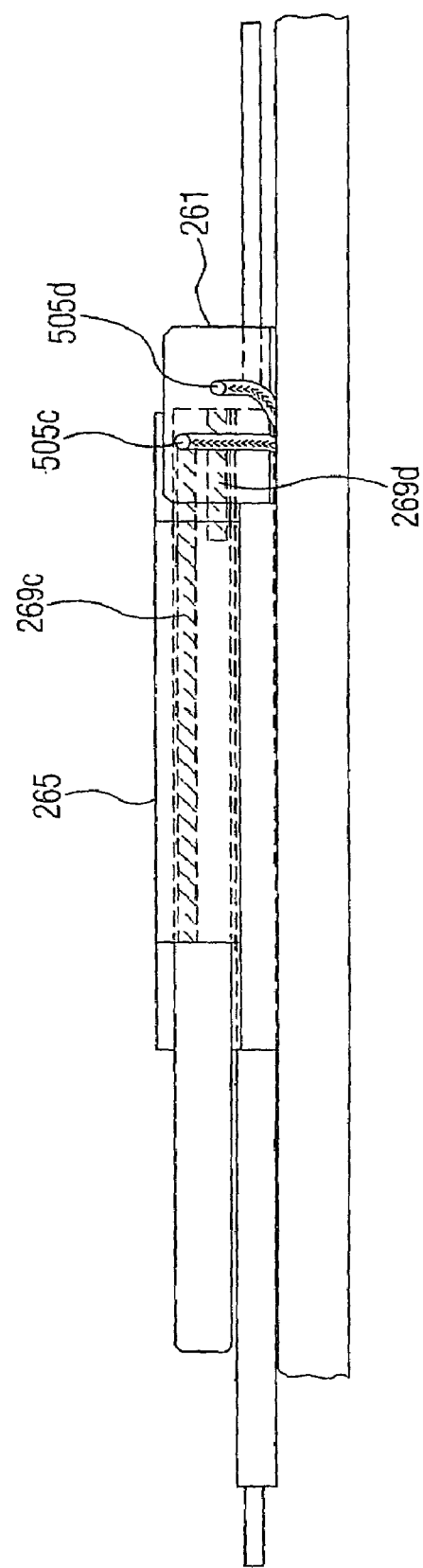
FIG. 11C is an elevation view of the cam rotation sensors and targets in a fully docked and locked position.

As an exemplary embodiment, FIGS. 8C, 9C, 10C, and 11C show a view of a representative target 265 (shown in FIG. 5C and FIG. 12) and sensing heads 505c and 505d at four different points of cam rotation that are of interest. In FIGS. 5C, 6C, 7C, and 8C the cams are at the enter/exit point of rotation. In FIG. 8C the dock is additionally in the ready to actuate position. Here, in these cases, both beams 510c and 510d (not visible in FIG. 8C because the beams are light rays that are normal to the page, and behind heads 505c and 505d respectively; see FIG. 12 for beams 510c and 510d) are hitting the reflective surface of target 265, and their respective amplifiers 256 and 257 (see FIG. 3A) will both indicate that reflected light is present. In FIG. 9C the cam 110 (see FIG. 9A) is moved to a mid way position (for example 430 in FIG. 4). Here beam 510c (see FIG. 12) is hitting the non-reflective surface 269c, and beam 510d (see FIG. 12) is hitting the reflective surface of target 265. Accordingly amplifier 256 (see FIG. 3A), which is coupled to sensing head 505c, will indicate an absence of reflected light; and amplifier 257 (see FIG. 3A), which is coupled to sensing head 505d, will indicate a presence of reflected light. In FIG. 10C, the cams 110 (see FIG. 10A) are in the docked region, but not at the ends of grooves 129 (see FIG. 10A), thus corresponding to position 435 in FIG. 4. Both beams 510c and 510d (see FIG. 12) are hitting non-reflective surfaces 269c and 269d. Accordingly, both amplifiers 256 and 257 (see FIG. 3A) are indicating the absence of reflected light. It is noted in FIG. 10C that the non-reflective surface 269d extends to the left of sense head 505d. The left hand end of surface 269d corresponds to the predetermined control position 432. Thus amplifier 257 senses the change between reflected light and non-reflected light at the control position 432, and senses the absence of reflected light throughout the selected control region. Note that in this exemplary case, that both positions 432 and 435 are included in the selected control region. In FIG. 11C the cams 110 (see FIG. 11A) are at the end of their travel in grooves 129 (see FIG. 11A) and in the latched position. At this point beam 510c (see FIG. 12) is now hitting the reflective surface of target 265. Also it is seen that non-reflective strip 269d extends to the end of target 265. In the present position beam 510d (see FIG. 12) is beyond the end of target 265 and hitting neither target 265 nor strip 269d. Consequently, there is no reflected light from beam 510d. Thus, in this position, the output of amplifier 256 (see FIG. 3A) indicates the presence of reflected light, while the output of amplifier 257 (see FIG. 3A) indicates the absence of reflected light.

The following table summarizes the positions detected by the sensing arrangement that has been described.

| POSITION/REGION | AMPLIFIER 256 DETECTS | AMPLIFIER 257 DETECTS |
| --- | --- | --- |
| Cam Entry/Exit Position (e.g., positions 400, 410) | PRESENCE of reflected light | PRESENCE of reflected light |
| Captured Region plus Mid Way Region exclusive of Selected Control Region (e.g., positions 420 & 430) | ABSENCE of reflected light | PRESENCE of reflected light |
| Selected Control Region (e.g., positions 432, 435) | ABSENCE of reflected light | ABSENCE of reflected light |
| Docked and Latched Position (cam at end of travel, position 440) | PRESENCE of reflected light | ABSENCE of reflected light |

Cam position sensing may be more generally referred to as position sensing for a mechanism that operates the assembly, where the assembly brings together the test head and the handling apparatus. As described above, in embodiments where cams are used as the mechanisms that operate the assembly, cam position sensing can be used to determine if the test head and handling apparatus are in one of several positions relative to one another. For example, the cam position sensors may sense the system is in a first position where at least one of the cams, being located on one of the test head and the handling apparatus, is ready to receive a respective cam follower (located on the other of the test head and the handling apparatus). Another example is if the cam position sensors sense that the system is in a docked position where the test head and the handling apparatus are docked together. Further, the cam position sensors may sense that the system is in a position between the first position and the docked position.

It is to be noted that the above scheme may be changed to provide detection of other position and region conditions if it is so desired. Also, there are numerous other position sensor possibilities that may be used. For example, the use of a string potentiometer (or cable extension transducer) could provide a cost competitive solution. Also available are range finders, encoders, and electro mechanical possibilities incorporating electromagnetic devices, limit switches, and the like. With respect to the coarse alignment and ready to actuate sensing, alternative approaches include, but are not limited to, the use of range finders, proximity detectors, magnetic detection means, and imaging means.

With reference to FIGS. 5A through 11C, we can now consider the process of docking a test head 100 to a handler apparatus 108 using the present invention. Many of these figures have been previously described, and these details will not all be repeated. It is assumed that a system controller is used to read and act upon the outputs of the sensors as well as to control the several actuators in order to assist an operator. The system controller may also control additional functions of the manipulator.

Figure 5A:
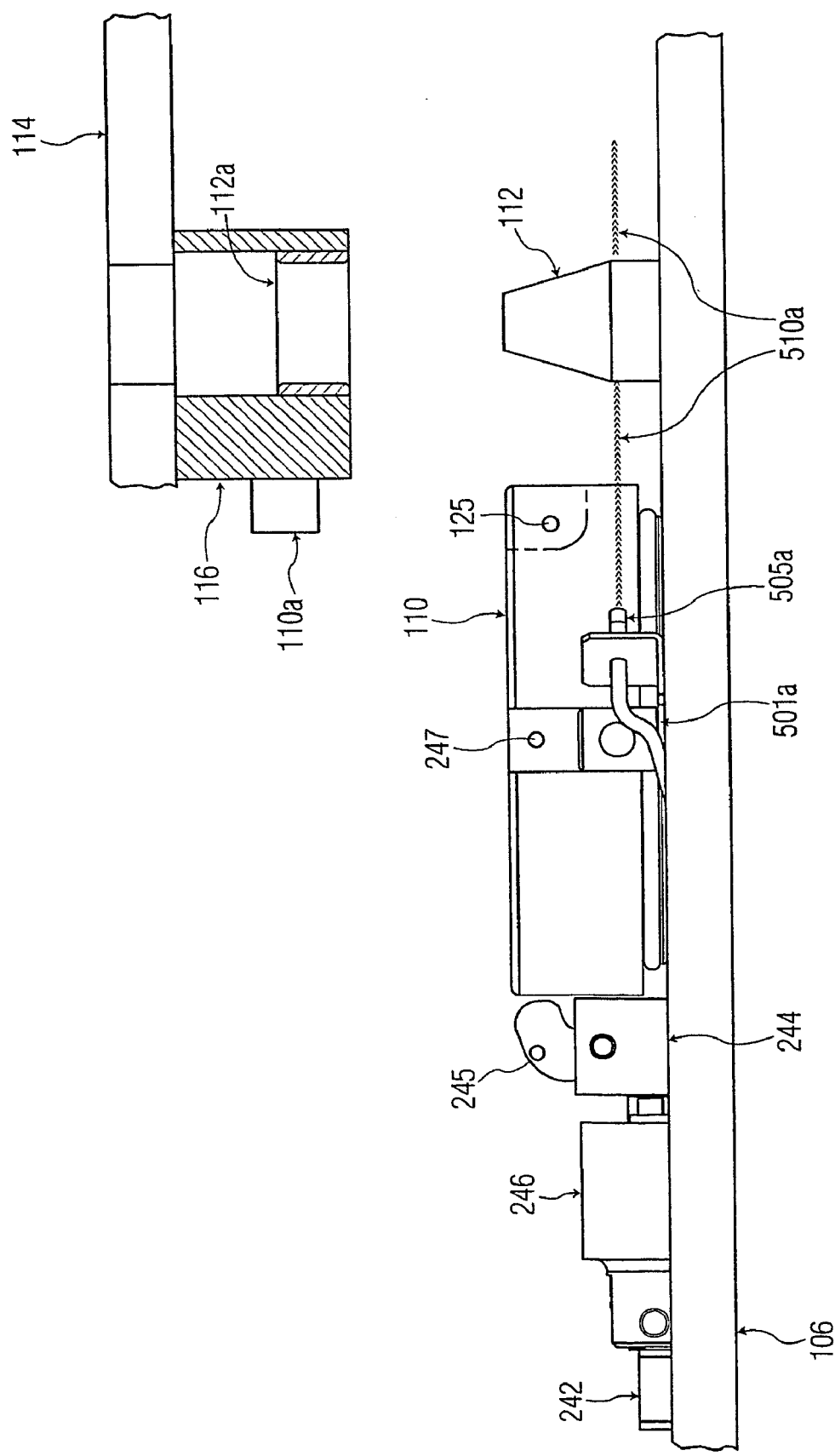
FIG. 5A is a cross section of a cam and gusset in the ready to dock position.
Figure 5B:
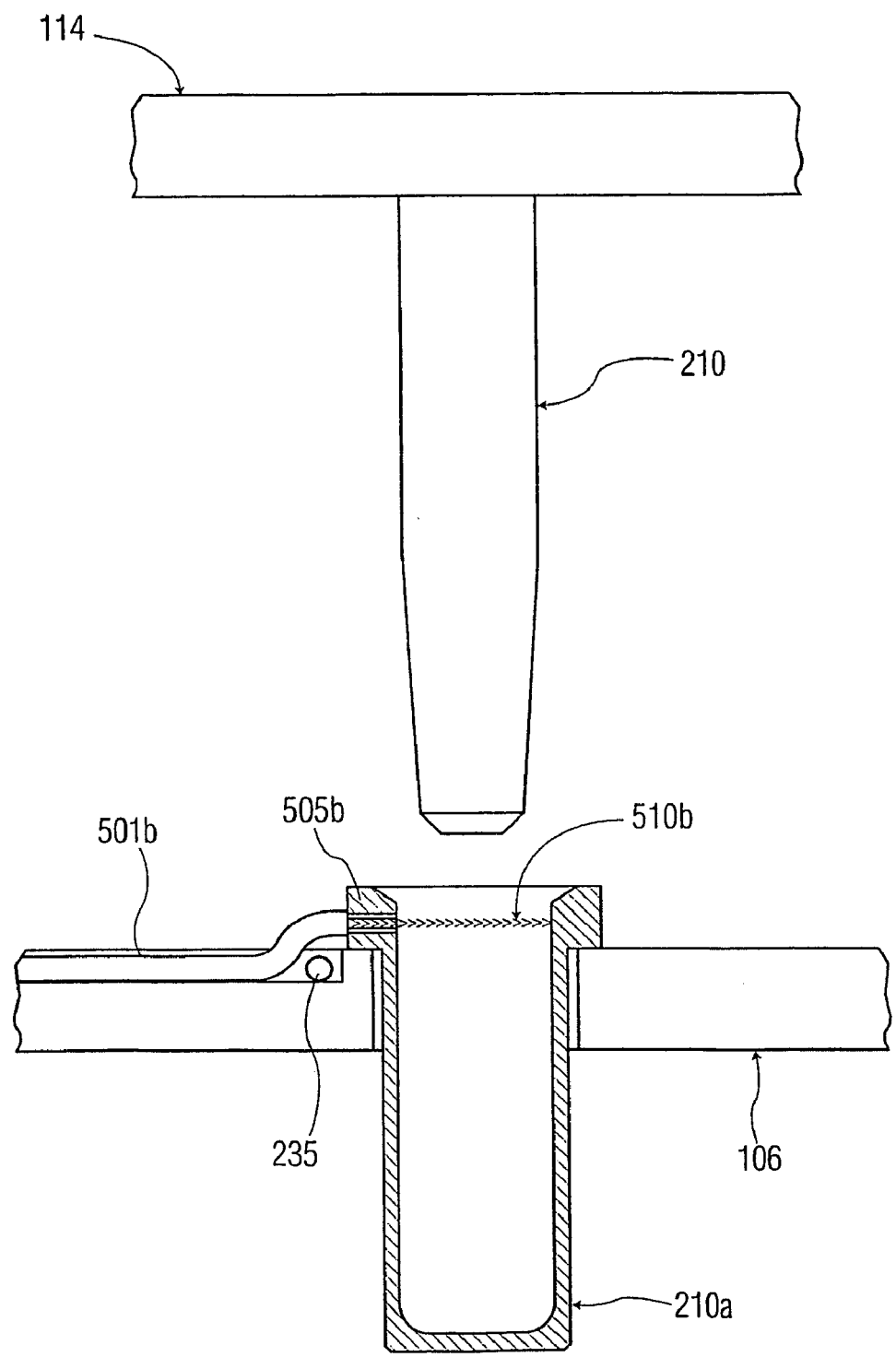
FIG. 5B is a cross section of a coarse alignment pin and guide bushing in the ready to dock position.
Figure 5C:
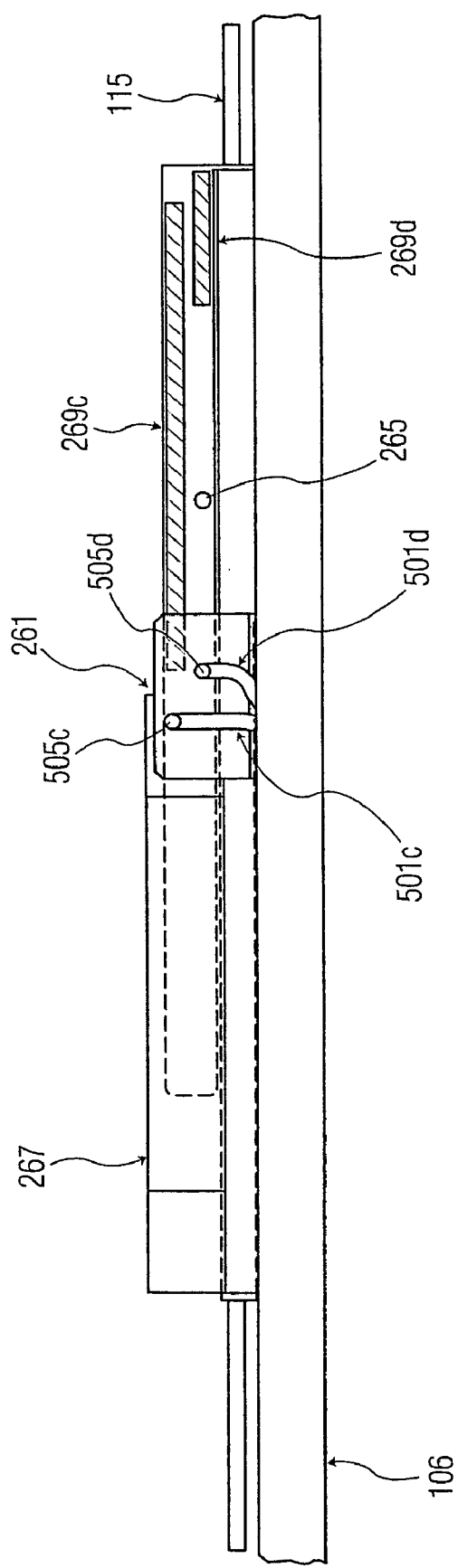
FIG. 5C is an elevation view of the cam rotation sensors and targets in the ready to dock position.
Figure 6A:
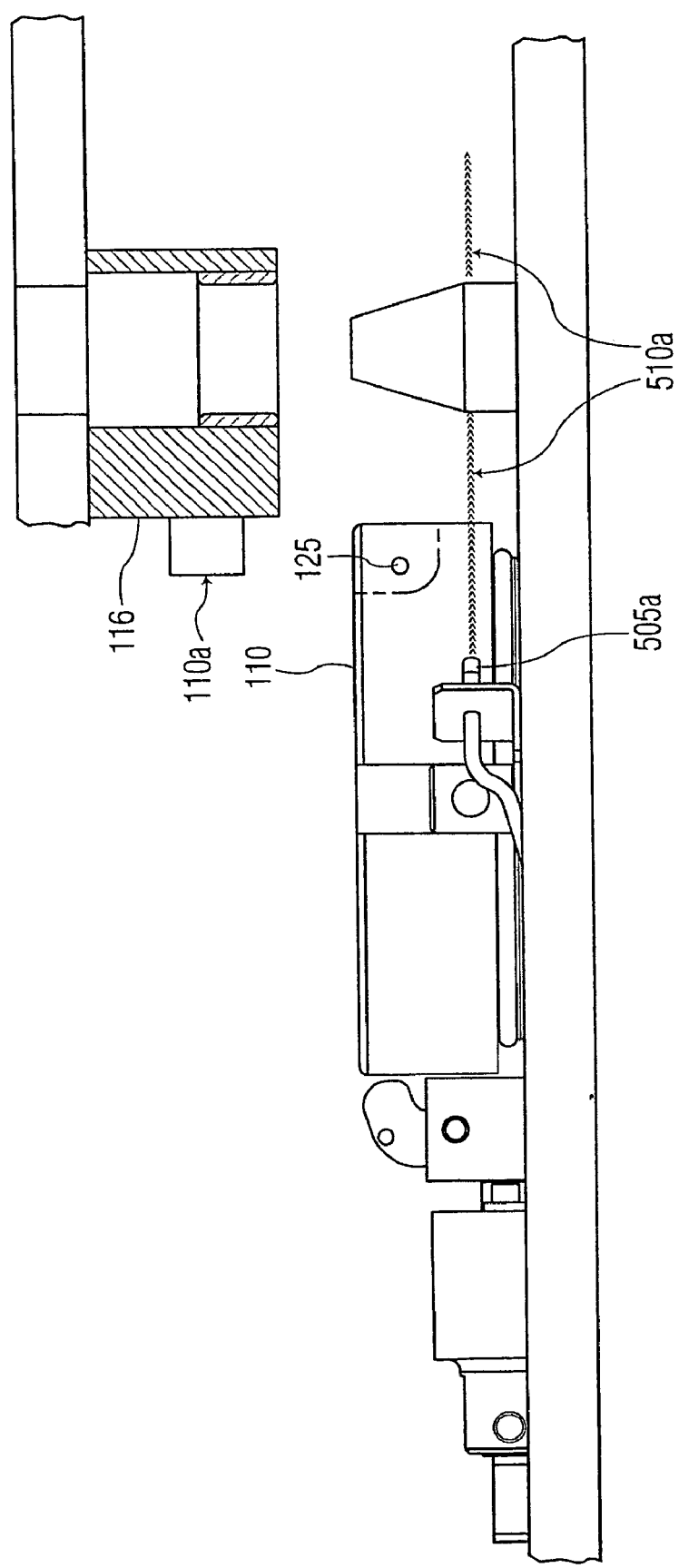
FIG. 6A is a cross section of a cam and gusset in a first coarse alignment position.

In FIGS. 5A through 5C the test head 100 has been brought into close proximity to the handler apparatus 108. The coarse alignment pins 210 have not yet been inserted into their respective guide bushings 210a. The cams 110 are all in the enter/exit position and ready to receive their respective cam followers 110a. The cam rotation sensors are indicating that the cams are in the enter/exit to capture region. In FIGS. 6A through 6C at least one coarse alignment pin 210 has penetrated its guide bushing 210a as indicated by its respective coarse alignment sensor. With the assistance of the controller, the operator will strive to have all four coarse alignment pins 210 inserted into their respective bushings 210a. The controller, monitoring sensor amplifiers 251, 254, 255, and 259 may provide feedback to the operator by means of visual indicators or displays, audio signals, or other means. In FIGS. 7A through 7C, all coarse alignment pins 210 have been approximately halfway inserted into their respective bushings 210a. The gussets 116 are aligned with and adjacent to their respective cams 110. The cam followers 110a have entered their respective cam cut outs 125, and the tapered ends of guide pins 112 have entered their respective guide pin receptacles 112a. The length and diameter of the coarse alignment pins 210 and the diameter of coarse alignment bushings 210a must be designed to insure that the tapered ends of guide pins 112 are inserted into their receptacles 112a at this point.

In FIGS. 8A through 8C the cam followers 110a are fully inserted into their respective cutouts 125, and the light beams 510a have been reflected, as previously described. Accordingly, sensing amplifiers 252, 253, 258 all indicate a presence of reflected light; this in turn indicates to the controller that the test head is in the ready to actuate condition. At this position, alignment in five degrees of freedom has been achieved. In particular, if the plane of the handler apparatus electrical interface 126 is the X-Y plane of three dimensional interface, guide pins 112 having their full diameter inserted into receptacles 112a has established X, Y, and theta Z alignment. Furthermore, the insertion of cam followers 110a fully into all cut outs 125 has established planarization between the handler apparatus electrical interface 126 and the test head electrical interface 128. The cams may now be actuated with relatively low force to move the cam followers into the capture region. Here the cam groove 129 is parallel to the faceplate 106 and electrical interfaces 126 and 128, so no insertion or compression of contacts occurs. The controller may invoke this small motion automatically by injecting air into pneumatic cylinders 223 and 224. In an alternative embodiment, the controller may display a signal to the operator to manually rotate the cams 110 by means of handles 135. In still other embodiments the foregoing may be combined; that is, the controller might signal the operator for manual interaction while simultaneously injecting a small amount of air into the cylinders 123 and 124 that is insufficient to cause rotation alone, but sufficient to reduce the force that the operator needs to supply. As such, this is another example of operator intervention in a partially powered docking system (or alternatively, "only partially" powered). During this motion into the capture region, the controller may monitor the cam rotation sensor amplifiers 256 and 257. When the output of amplifier 256 switches from detecting the absence of reflected light to detecting the presence of reflected light, the cam followers 110a have reached the end of the capture region. Further cam motion will bring them into the sloping groove 129 in the mid way region.

FIGS. 9A through 9C illustrate the situation when the cams 110 have been rotated into a midway position such as position 430 in FIG. 4, which has been previously described, and which may include a portion of the selected control region. In this region, it is typical that the actuation force required to dock the test head 100 must overcome the insertion and compression of hundreds or thousands of electrical contacts. Accordingly, the controller may supply air pressure to pneumatic cylinders 223 and 224 to generate a tension in cables 115 in a direction to move the cams towards docked position 440. In certain applications, it is preferred to supply sufficient air pressure to enable the desired motion to be fully automated. In other applications, it is preferred to supply a reduced air pressure that is insufficient to cause motion but sufficient to reduce the amount of force that an operator must apply to docking handle 135 to an acceptable level. Again, this is yet another example of operator intervention in a partially powered docking system (or alternatively, "only partially" powered). The controller may monitor the outputs of sensing amplifiers 256 and 257 to determine when the motion has reached the end-points of this mid way region. Further, if the motion is to undock the test head 100, the required force will generally be less because the compressed contact pins exert force in the direction of undocking. However, during undocking it is likely that still other electrical contacts and connectors will be drawn apart, requiring some amount of force to do so. Thus, if pneumatic cylinders 225 226 are double action, air pressure may be utilized to provide powered, or only partially powered undocking (requiring manual intervention) or at least partially powered undocking (herein defined as either fully or only partially powered).

FIGS. 10A through 10C illustrate the situation when the cam followers 110 are in the docked region, but the cams are not at their final, fully-rotated positions. It is noted again that in this region both the outputs of both cam rotation sensing amplifiers 256 and 257 are in the absence of reflected light state.

Finally, FIGS. 11A through 11C illustrate the situation when the cams 110 are fully rotated and cam followers 110a have reached the ends of grooves 129. Attainment of this position is indicated by the transition of the output of sensing amplifier 256 to the presence of reflected light state. In this position latch slot 247 is aligned with latch 245, and the controller can energize pneumatic cylinder 246 to cause latch 245 to be inserted into slot 247, which latches the cams in place, as shown in FIG. 11A. To undock, the latch 245 must first be retracted clear of slot 247 before the cams 110 can be rotated by any means.

It is observed that when in the docked position, a loss of power or air supply will not cause the cams to rotate and the dock to become undocked. This is independent of whether the latch is latched or not. Also in the case of power or air pressure loss, the dock may be operated by hand as might be required provided sufficient force can be applied by a maintenance person or operator.

It is worthwhile to examine in further detail the design of non-reflective strips 269c and 269d. The first end of strip 269c (the left end in FIG. 12) is desirably located such that, when docking, light beam 510c moves from a reflective target 265 surface to the non-reflective strip 269c as the cam 110 is moved away from the cam entry/exit position 410 to a captured position such as 420. The goal is to sense when cam 110 is in a position to allow cam follower 115 to enter or exit opening 125. This initial cam motion is typically small and in the captured region and is essentially horizontal requiring relatively little force. Thus, an operator may manually accomplish this initial motion without powered assistance. When light beam 510c transitions from the reflective surface to strip 269c, the output of amplifier 256 changes state, thereby providing a signal to apply air pressure. The second end of strip 269c (the right end in FIG. 12) is located such light beam 510c transitions from non-reflective strip 269c to the reflective surface of target 265 when cam 110 arives at the docked and latched position 440. The first end (the left end in FIG. 12) of non-reflective strip 269d is located such that light beam 510d transitions from the reflective surface of target 265 to the non-reflective surface of strip 269d when the selected control point 432 is reached during docking. The second end (the right hand end in FIG. 12) of strip 269d extends fully to the end of target 265 so that light beam 510d does not transition to reflected light when docked and latched position 440 is reached during docking.

Control position 432 may be selected for varying purposes for different specific applications. Some examples include the following:

The required docking force may change abruptly from one value to another as the cam traverses the mid way region. Control position 432 could then be selected to cause the controller to make an appropriate corresponding change in air pressure at the point where the force changes.

In certain applications cam groove 129 may have two distinct slopes. For example the mid way region adjacent to the captured region may provide an initial steep slope. At a certain point the slope may change to a gradual slope which continues to the transition to no slope in the docked region. The point where the slope transitions from one value to the other may be desirably selected to be control position 432.

During docking or undocking it may be necessary to supply a signal to an external apparatus when, for example, a certain point in the midway region is reached. The control position 432 may be selected for this purpose.

The control position 432 may be selected to be near or within the docked region, for example position 435, in applications where it is desired to shut off or substantially change the supplied air pressure prior to reaching the docked and latched position 440. This possibility may also be used to signal a point to supply air pressure when undocking, if desired.

The control position 432 may be selected to be closely adjacent to the captured region to provide a signal assuring that cam follower 110a has been securely captured by cam 110.

Other purposes and locations for control position 432 will occur to those skilled in the art. It is also obvious that as equipment becomes more and more automated that it may be desirable to have a plurality of control positions 432. This can be accommodated within the scope of the present invention by aforementioned means of implementing the cam position sensor.

In the above, the invention has been described in terms of a dock having circular cams. It will be apparent to those who are familiar with the art, that the same principles can be applied with equal advantage to docks having linear cams.

Figure 13:
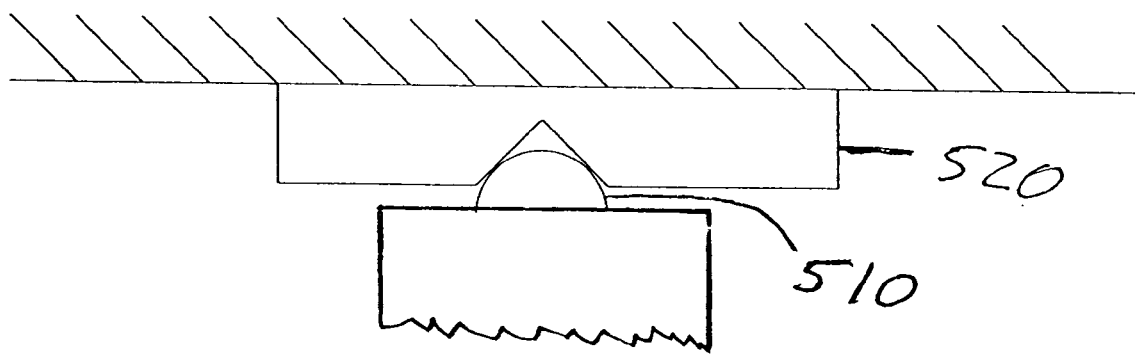
FIG. 13 is a side view of an alignment Pair which includes kinematic surfaces.

In the above description, guide pins have been primarily described as an alignment feature. Additionally, guide pin receptacles have been described as the corresponding alignment feature receptacles; however, it is clear that the alignment features and alignment feature receptacles may include any type of alignment pair. An exemplary alignment pair is illustrated in FIG. 13 where a kinematic interface is shown. For example, the alignment features may be kinematic mating surfaces 510 such as balls. Further, the alignment feature receptacles 520 may include kinematic surfaces. For example, the alignment feature receptacles may be grooves including two kinematic surfaces.

In the embodiment described above, pneumatic cylinders 225 and 226 have been used as linear actuators to operate the dock. Other types of linear actuators may also be adapted to the application, for example electrical motor powered actuators or electrical solenoids. Alternatively, a rotating motor and appropriate gearing may be added to impart powered rotation to one of the circular cams or cable driver (if so equipped) in a dock having circular cams or to a bell crank in a dock which incorporates linear cams and linkage. The rotating motor could be electrical or pneumatic.

Although illustrated and described herein with reference to certain specific embodiments, the present invention is nevertheless not intended to be limited to the details shown. Rather, various modifications may be made in the details within the scope and range of equivalence of the claims and without departing from the spirit of the invention.

What is claimed:

1. A system for docking an electronic test head with a handling apparatus, comprising:
    an assembly for bringing together said electronic test head with said handling apparatus;
    a mechanism for operating said assembly;
    at least one actuator for operating said mechanism; and
    at least one sensor for detecting a position of said mechanism.

2. A system for docking an electronic test head with a handling apparatus according to claim 1, wherein said assembly is for at least partially aligning and subsequently bringing together said electronic test head with said handling apparatus; and
    wherein said actuator is a power driven actuator for providing only partially powered assistance in bringing together said electronic test head with said handling apparatus.

3. A system for docking an electronic test head with a handling apparatus according to claim 2, wherein said test head and said handling apparatus are aligned prior to electrical contact therebetween.

4. A system for docking an electronic test head with a handling apparatus according to claim 2, wherein said actuator is powered by a variable amount of air pressure to vary tactile response during operation of said assembly.

5. A system for docking an electronic test head with a handling apparatus according to claim 2, wherein further alignment between said electronic test head and said handling apparatus occurs during bringing together of said electronic test head with said handling apparatus.

6. A system for docking an electronic test head with a handling apparatus according to claim 2 additionally comprising:
    a plurality of alignment features on one of said test head and said handling apparatus; and
    a plurality of alignment feature receptacles on the other of said test head and said handling apparatus for receiving said alignment features.

7. The system of claim 6 wherein said alignment features are guide pins, and said alignment feature receptacles are guide pin receptacles.

8. The system of claim 7 wherein each of said guide pin receptacles is included in one of a plurality of gussets mounted on one of said test head and said handling apparatus, each of said gussets aligning adjacent to at least one respective cam mounted on the other of said test head and said handling apparatus.

9. The system of claim 6 wherein at least one of said alignment features includes a kinematic mating surface, and a corresponding alignment feature receptacle includes a kinematic surface.

10. The system of claim 9 wherein said kinematic mating surface includes a ball, and said alignment feature receptacle includes a groove.

11. The system of claim 9 wherein said system includes three of said kinematic mating surfaces and three of said alignment feature receptacles, each of said kinematic mating surfaces including a ball.

12. A system for docking an electronic test head with a handling apparatus according to claim 2 additionally comprising:
    a plurality of cams, for operating said assembly, mounted on one of said test head and said handling apparatus; and
    a plurality of gussets mounted on the other of said test head and said handling apparatus for providing coarse alignment between said test head and said handling apparatus, each of said gussets aligning adjacent at least one of said cams upon said test head and said handling apparatus being brought towards each other.

13. The system of claim 12 wherein said system additionally comprises:
    at least one additional sensor for sensing at least one of (a) a position of at least one of said cams, and (b) said test head and said handling apparatus being positioned relative to one another in a coarser one of at least two positions of alignment.

14. A system for docking an electronic test head with a handling apparatus according to claim 2 additionally comprising:
    at least one sensor for detecting that said test head and said handling apparatus are positioned relative to each other such that said power driven actuator is operable to bring said electronic test head and said handling apparatus towards each other.

15. A system for docking an electronic test head with a handling apparatus according to claim 14, wherein said sensor is further for enabling operation of said power driven actuator.

16. The system of claim 1 wherein said mechanism comprises at least two cams.

17. A system for docking an electronic test head with a handling apparatus according to claim 16, operation of said two cams being mechanically synchronized.

18. A system for docking an electronic test head with a handling apparatus according to claim 16, further comprising a target which moves with said mechanism, wherein said sensor detects light reflected off of said target.

19. A system for docking an electronic test head with a handling apparatus according to claim 16, wherein said sensor senses at least one of:
   a first position where at least one of said cams, located on one of said test head and said handling apparatus, is ready to receive a respective cam follower, located on the other of said test head and said handling apparatus;
   a docked position where said test head and said handling apparatus are docked together; and
   a position between said first position and said docked position.

20. The system of claim 1 additionally comprising:
   at least one additional sensor for sensing at least one of (a) said test head and said handling apparatus being positioned relative to one another in a coarser one of at least two positions of alignment, and (b) said test head being positioned relative to said handling apparatus such that said at least one actuator is operable to bring said electronic test head and said handling apparatus towards each other.

21. The system of claim 1 additionally comprising:
   a plurality of alignment features on one of said test head and said handling apparatus; and
   a plurality of alignment feature receptacles on the other of said test head and said handling apparatus for receiving said alignment features.

22. A system for docking an electronic test head with a handling apparatus according to claim 1, wherein a plurality of cams are situated on one of said test head and said handling apparatus, for operating said assembly;
   a plurality of gussets are situated on the other of said test head and said handling apparatus, each of said gussets for aligning adjacent to at least one of said plurality of cams;
   wherein said actuator is a power driven actuator for providing powered operation of said cams; and
   wherein said sensor is for detecting that said test head and said handling apparatus are positioned relative to one another in a coarser one of at least two positions of alignment.

23. The system of claim 22 additionally comprising:
   a plurality of alignment features on one of said test head and said handling apparatus; and
   a plurality of alignment feature receptacles on the other of said test head and said handling apparatus for receiving said alignment features.

24. The system of claim 22 wherein said alignment features are guide pins, and said alignment feature receptacles are guide pin receptacles.

25. The system of claim 24 wherein each of said guide pin receptacles is included in one of said plurality of gussets.

26. The system of claim 22 wherein at least one of said alignment features includes a kinematic mating surface, and a corresponding alignment feature receptacle includes a kinematic surface.

27. The system of claim 26 wherein said kinematic mating surface includes a ball, and said corresponding alignment feature receptacle includes a groove.

28. The system of claim 26 wherein said system includes three of said kinematic mating surfaces and three of said alignment feature receptacles, each of said kinematic mating surfaces including a ball.

29. The system of claim 22 additionally comprising:
   at least one additional sensor for sensing at least one of (a) a position of at least one of said cams, and (b) said test head being positioned relative to said handling apparatus such that said at least one actuator is operable to bring said electronic test head and said handling apparatus towards each other.

30. A system for docking an electronic test head with a handling apparatus according to claim 1, wherein a plurality of cams are on one of said test head and said handling apparatus;
   gussets are on the other of said test head and said handling apparatus for mating with said cams in order to dock said test head with said handling apparatus; and
   cam followers are attached to said gussets for engaging said cams;
   wherein said at least one sensor is for determining a relative position between said test head, and said handling apparatus when at least one of said cam followers is engaged with a respective cam.

31. A system for docking an electronic test head with a handling apparatus according to claim 30, further comprising a plurality of alignment features on one of said test head and said handling apparatus for aligning said test head with said handling apparatus.

32. A system for docking an electronic test head with a handling apparatus according to claim 30, wherein powering of said cams is manually overidable.

33. A system for docking an electronic test head with a handling apparatus according to claim 30, wherein said test head and said handling apparatus are aligned in X, Y, and θz prior to making electrical contact.

34. A system for docking an electronic test head with a handling apparatus according to claim 30, wherein said sensor senses at least one of:
   an actuatable position where said actuators are ready to be actuated;
   a docked position where said test head and said handling apparatus are docked together; and
   a position between said actuatable position and said docked position.

35. A system for docking an electronic test head with a handling apparatus according to claim 30, wherein said sensor is a photoelectric sensor.

36. A system for docking an electronic test head with a handling apparatus according to claim 30, wherein said sensor is a photoelectric sensor which conveys light over fiber optics.

37. A system for docking an electronic test head with a handling apparatus according to claim 30, wherein said test head remains docked to said handling apparatus after a loss of power.

38. A system for docking an electronic test head with a handling apparatus according to claim 30, wherein said system includes gussets on one of said test head and said handling apparatus for protecting electrical contacts on at least one of said test head and said handling apparatus prior to docking.

39. A system for docking an electronic test head with a handling apparatus according to claim 16, wherein at least two cams are situated on one of said test head and said handling apparatus for operating said assembly;
- a plurality of gussets are situated on the other of the test head and the handling apparatus, each of said gussets for aligning adjacent to at least one of said plurality of cams;
- said at least one actuator is a power driven actuator for providing at least partially powered operation of said cams; and at least one handle is included for optional manual operation of at least one of said cams, said manual operation being in addition to, or independent of, said at least partially powered operation of said cams;
- a plurality of alignment features are situated on one of said test head and said handling apparatus;
- a plurality of alignment feature receptacles are on the other of said test head and said handling apparatus for receiving said alignment features.

40. The system of claim 39 wherein said alignment feature includes a kinematic mating surface and said alignment feature receptacle includes at least on kinematic surface.

41. The system of claim 39 additionally comprising:
- at least one sensor for sensing at least one of (a) a position of at least one of said cams, (b) said test head being positioned relative to said handling apparatus such that said at least one actuator is operable to bring said electronic test head and said handling apparatus towards each other, and (c) said test head and said handling apparatus being positioned relative to one another in a coarser one of at least two positions of alignment.

* * * * *

UNITED STATES PATENT AND TRADEMARK OFFICE
CERTIFICATE OF CORRECTION

| | | |
|---|---|---|
| PATENT NO. | : 7,109,733 B2 | Page 1 of 1 |
| APPLICATION NO. | : 10/484014 | |
| DATED | : September 19, 2006 | |
| INVENTOR(S) | : Gudin et al. | |

It is certified that error appears in the above-identified patent and that said Letters Patent is hereby corrected as shown below:

At Column 27, line 5, "claim 16," should read --claim 1,--

Signed and Sealed this

Eighth Day of July, 2008

JON W. DUDAS
*Director of the United States Patent and Trademark Office*